US009129696B2

(12) United States Patent
Joo et al.

(10) Patent No.: US 9,129,696 B2
(45) Date of Patent: Sep. 8, 2015

(54) METHOD OF READING MEMORY CELLS WITH DIFFERENT THRESHOLD VOLTAGES WITHOUT VARIATION OF WORD LINE VOLTAGE AND NONVOLATILE MEMORY DEVICE USING THE SAME

(71) Applicant: SAMSUNG ELECTRONICS CO., LTD., Suwon-Si, Gyeonggi-Do (KR)

(72) Inventors: Sang-Hyun Joo, Hwaseong-si (KR); Kiwhan Song, Seoul (KR); Ju Seok Lee, Seoul (KR); Kihwan Choi, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/340,773

(22) Filed: Jul. 25, 2014

(65) Prior Publication Data

US 2014/0334233 A1 Nov. 13, 2014

Related U.S. Application Data

(63) Continuation of application No. 13/608,030, filed on Sep. 10, 2012, now Pat. No. 8,811,088.

(30) Foreign Application Priority Data

Sep. 29, 2011 (KR) .................. 10-2011-0098809

(51) Int. Cl.
G11C 16/08 (2006.01)
G11C 16/26 (2006.01)
G11C 11/56 (2006.01)
G11C 16/04 (2006.01)

(52) U.S. Cl.
CPC ............ *G11C 16/26* (2013.01); *G11C 11/5642* (2013.01); *G11C 16/0483* (2013.01); *G11C 16/08* (2013.01); *G11C 2211/563* (2013.01)

(58) Field of Classification Search
CPC ............... G11C 16/0483; G11C 16/26; G11C 11/5642; G11C 2211/563; G11C 211/5631
USPC ............... 365/148, 158, 163, 185.03, 185.18, 365/185.21, 185.22, 185.25
See application file for complete search history.

(56) References Cited

U.S. PATENT DOCUMENTS

| 7,379,340 | B2 * | 5/2008 | Hosono et al. ........... 365/185.21 |
| 7,468,908 | B2 | 12/2008 | Tanaka |
| 7,508,704 | B2 | 3/2009 | Honma et al. |
| 7,599,224 | B2 | 10/2009 | Lee |
| 7,808,832 | B2 | 10/2010 | Mokhlesi |
| 8,009,470 | B2 | 8/2011 | Iwai et al. |

(Continued)

FOREIGN PATENT DOCUMENTS

| JP | 2010532541 A | 10/2010 |
| KR | 632329 | 9/2006 |

(Continued)

*Primary Examiner* — Tan T. Nguyen
(74) *Attorney, Agent, or Firm* — Volentine & Whitt, PLLC

(57) ABSTRACT

A soft-decision read method of a nonvolatile memory device includes receiving a soft-decision read command, applying a read voltage to a selected word line, pre-charging bit lines respectively connected to selected memory cells of the selected word line, continuously sensing states of the selected memory cells. The pre-charged voltages of the bit lines and the read voltage supplied to the selected word line are not varied during the sensing states of the selected memory cells.

20 Claims, 27 Drawing Sheets

(56) References Cited

U.S. PATENT DOCUMENTS

| | | | |
|---|---|---|---|
| 8,908,456 B2 * | 12/2014 | Park et al. | 365/203 |
| 2005/0078524 A1 | 4/2005 | Hosono | |
| 2006/0114733 A1 | 6/2006 | Hosono | |
| 2008/0094910 A1 | 4/2008 | Sim | |
| 2008/0253194 A1 | 10/2008 | Sim | |
| 2009/0141561 A1 | 6/2009 | Yang et al. | |
| 2010/0034019 A1 | 2/2010 | Kang et al. | |
| 2010/0329031 A1 | 12/2010 | Lee | |
| 2011/0038215 A1 | 2/2011 | Huh et al. | |
| 2011/0075480 A1 * | 3/2011 | Cernea | 365/185.03 |
| 2011/0280070 A1 | 11/2011 | Kim et al. | |
| 2012/0008419 A1 * | 1/2012 | Ha et al. | 365/185.25 |

FOREIGN PATENT DOCUMENTS

| | | |
|---|---|---|
| KR | 771520 | 10/2007 |
| KR | 20100018318 | 2/2010 |
| KR | 960447 | 6/2010 |
| KR | 1020100057784 A | 6/2010 |
| KR | 10-1012982 B1 | 2/2011 |
| KR | 1020110016229 A | 2/2011 |

* cited by examiner

METHOD OF READING MEMORY CELLS WITH DIFFERENT THRESHOLD VOLTAGES WITHOUT VARIATION OF WORD LINE VOLTAGE AND NONVOLATILE MEMORY DEVICE USING THE SAME

CROSS-REFERENCE TO RELATED APPLICATIONS

This is a Continuation application of U.S. application Ser. No. 13/608,030, filed Sep. 10, 2012, in which a claim of priority under 35 U.S.C §119 is made to Korean Patent Application No. 10-2011-0098809 filed Sep. 29, 2011, the entirety of which is incorporated by reference herein.

BACKGROUND

Exemplary embodiments relate to nonvolatile memory devices including memory cells each having a variable threshold voltage.

Semiconductor memories are considered to be perhaps the most vital microelectronic component of digital logic system design, such as computers and microprocessor-based applications ranging from satellites to consumer electronics. Therefore, advances in the fabrication of semiconductor memories including process enhancements and technology developments through scaling for higher densities and faster speeds help establish performance standards for other digital logic families.

Semiconductor memory devices include, for example, volatile random access memories (RAMs) and non-volatile memory devices. In the case of volatile RAMs, logic information is typically stored either by setting up the logic state of a bistable flip-flop such as in a static random access memory (SRAM), or through the charging of a capacitor as in a dynamic random access memory (DRAM). In either case, the data are stored and can be read out as long as the power is applied, and are lost when the power is turned off; hence, they fall in the category of volatile memories.

Non-volatile memories, such as Mask Read-Only Memory (MROM), Programmable Read-Only Memory (PROM), Erasable Programmable Read-Only Memory (EPROM), and Electrically Erasable Programmable Read-Only Memory (EEPROM), are capable of retaining stored data even with the power turned off. The non-volatile memory data storage mode may be permanent or reprogrammable, depending upon the fabrication technology used. Non-volatile memories are used for program and microcode storage in a wide variety of applications in the computer, avionics, telecommunications, and consumer electronics industries. A combination of single-chip volatile as well as non-volatile memory storage modes is also available in devices such as non-volatile SRAM (nvSRAM) for use in systems that require fast, programmable non-volatile memory. In addition, dozens of special memory architectures have evolved which contain some additional logic circuitry to optimize their performance for application-specific tasks.

In non-volatile memories, however, MROM, PROM, and EPROM are not free to be erased and written to by a system itself, so that it is not easy for general users to update stored contents. On the other hand, EEPROM is capable of being electrically erased or written. Application of the EEPROM has expanded to an auxiliary memory or to system programming where continuous updates are needed (e.g., flash EEPROM).

SUMMARY

One aspect of embodiments of the inventive concept is directed to a soft-decision read method of a nonvolatile memory device. The soft-decision read method comprises receiving a soft-decision read command; applying a read voltage to a selected word line; pre-charging bit lines respectively connected to selected memory cells of the selected word line; and continuously sensing states of the selected memory cells, wherein the pre-charged voltages of the bit lines and the read voltage supplied to the selected word line are not varied during the sensing states of the selected memory cells.

Another aspect of embodiments of the inventive concept is directed to a nonvolatile memory device comprising a memory cell array having memory cells arranged at intersections of word lines and bit lines; a row selector circuit configured to drive a selected one of the word lines; and a read/write circuit having page buffers respectively connected to the bit lines; and control logic configured to control the read/write circuit and the row selector circuit, wherein the control logic controls a soft-decision read operation in which bit lines respectively connected to selected memory cells of a selected word line supplied with a read voltage are pre-charged and voltages of sensing nodes respectively corresponding to the bit lines are latched at least two times as first data and second data while the pre-charged voltages of the bit lines and a read voltage supplied to the selected word line are not varied; and wherein the control logic variably controls respective develop times of continuous sensing operations of the read operation.

BRIEF DESCRIPTION OF THE FIGURES

The above and other objects and features will become apparent from the description that follows with reference to the accompanying drawings, wherein like reference numerals refer to like parts throughout the various figures unless otherwise specified.

DETAILED DESCRIPTION

Figure 1:
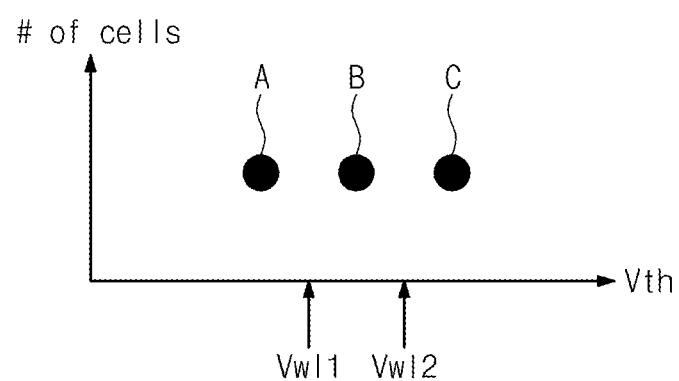
FIG. 1 is a diagram for describing a read method of a nonvolatile memory device according to an embodiment of the inventive concept.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a diagram for describing a read method of a nonvolatile memory device according to an embodiment of the inventive concept. The figure represents memory cells A, B and C having respectively different threshold voltages Vth.

A nonvolatile memory device may store data by changing threshold voltages of memory cells. Data stored in the memory cells may be discriminated (i.e., distinguished) on the basis of a read voltage that is applied to a word line. For example, a memory cell having a threshold voltage higher than a read voltage and a memory cell having a threshold voltage lower than the read voltage may be discriminated by applying the read voltage to a word line. A read operation, for example, may include a normal read operation, a verification read operation, a data recover read operation, a soft-decision read operation, a read retry operation, and the like. In FIG. 1, a memory cell C may be determined to be (i.e., detected as) an off cell when a read voltage Vwl2 is applied to a word line. At this time, memory cells A and B may be determined to be an on cell. When a read voltage Vwl1 is applied to the word line, the memory cells B and C may be determined as an off cell, and the memory cell A may be determined to be an on cell. The memory cell B having a threshold voltage between the read voltages Vwl1 and Vwl2 may be discriminated using two read voltages Vwl1 and Vwl2, for example. The memory cell B, for example, may be a memory cell which is determined to be an off cell on the basis of the read voltage Vwl1 and as an on cell on the basis of the read voltage Vwl2.

For an embodiment of the inventive concept, the memory cell B may be determined/detected using one read voltage Vwl2. For example, the memory cell B may be detected by continuously latching a voltage of a sensing node corresponding to a bit line of the memory cell B with the read voltage Vwl2 applied to a word line. At this time, a develop time of the sensing node or a voltage of the sensing node may be controlled during continuous sensing/latch operations. It is possible to detect the respective memory cells B and C via continuous sensing operations without a variation in a read voltage applied to the word line by controlling a develop time of the sensing node or a voltage of the sensing node. At this time, voltages of bit lines connected to the memory cells B and C may be maintained with an initial voltage (or, a precharged voltage) while a voltage of the sensing node is continuously latched/sensed. Thus, it is possible to detect/discriminate the respective memory cells B and C having different threshold voltages using one read voltage Vwl2 instead of two read voltages Vwl1 and Vwl2. Alternatively, it is possible to detect a memory cell having a threshold voltage lower than a read voltage using one read voltage Vwl2. This will be more fully described later.

Figure 2:
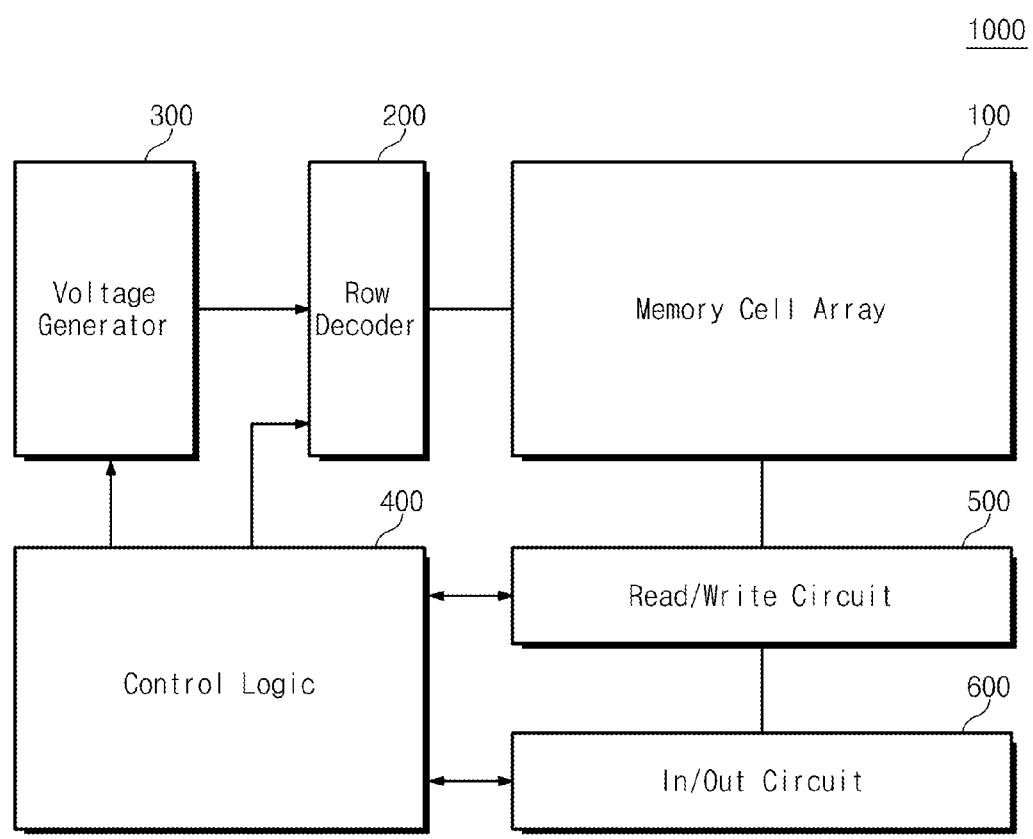
FIG. 2 is a block diagram schematically illustrating a nonvolatile memory device according to an embodiment of the inventive concept.

FIG. 2 is a block diagram schematically illustrating a nonvolatile memory device according to an embodiment of the inventive concept.

A nonvolatile memory device 10000 according to the inventive concept may be a NAND flash memory device, for example. However, the nonvolatile memory device 1000 of the inventive concept is not limited thereto. For example, the inventive concept may be applied to a vertical-type NAND flash memory device, a NOR flash memory device, a Resistive Random Access Memory (RRAM) device, a Phase-Change Memory (PRAM) device, a Magnetroresistive Random Access Memory (MRAM) device, a Ferroelectric Random Access Memory (FRAM) device, a Spin Transfer Torque Random Access Memory (STT-RAM), and the like.

Referring to FIG. 2, the nonvolatile memory device 1000 may include a memory cell array 100 that has memory cells arranged in rows (or, word lines: WL) and columns (or, bit lines: BL). Each memory cell may store 1-bit data or M-bit (multi-bit) data (M being an integer of 2 or more). Each memory cell may be realized by a memory cell having a charge storage layer such as a floating gate or a charge trap layer, a memory cell having a variable resistance element, or the like. The memory cell array 100 may be implemented to have a single-layer array structure (or, referred to as a two-dimensional array structure) or a multi-layer array structure (or, referred to as a three-dimensional/vertical array structure). Examples of the three-dimensional array structure are disclosed in U.S. Pat. No. 7,812,390 and U.S. Patent Publication No. 2008/0084729, the entireties of which are incorporated by reference herein.

A row selector circuit 200 may be configured to perform operations of selecting and driving rows of the memory cell array 100 under the control of control logic 400. A voltage generator circuit 300 may be controlled by the control logic 400, and may be configured to generate voltages (e.g., a program voltage, a pass voltage, an erase voltage, a read voltage, a verification voltage, etc.) required for program, erase, and read operations. A read/write circuit 500 may be controlled by the control logic 400, and may operate as a sense amplifier or as a write driver according to a mode of operation. For example, at a read operation, the read/write circuit 500 may act as a sense amplifier that senses data from memory cells of a selected row (or, selected memory cells thereof). The sensed data may be provided to an external device via an input/output circuit 600 by a given input/output data unit. Alternatively, for pass/fail verification, the sensed data may be provided to the control logic 400 via a wired-OR technique. An example of the wired-OR technique is disclosed in U.S. Pat. No. 7,830,720, the entirety of which is incorporated by reference herein. During a program operation, the read/write circuit 500 may act as a write driver that drives memory cells of a selected row according to program data. The read/write circuit 500 may include page buffers that correspond to bit lines or bit line pairs, respectively. In the case where each memory cell stores multi-bit/multi-level data, each page buffer of the read/write circuit 500 may include a number of latches that perform a logical function according to the control of the control logic 400. This will be more fully described later. The input/output circuit 600 may be configured to interface with an external device (e.g., a host or a memory controller).

Figure 3:
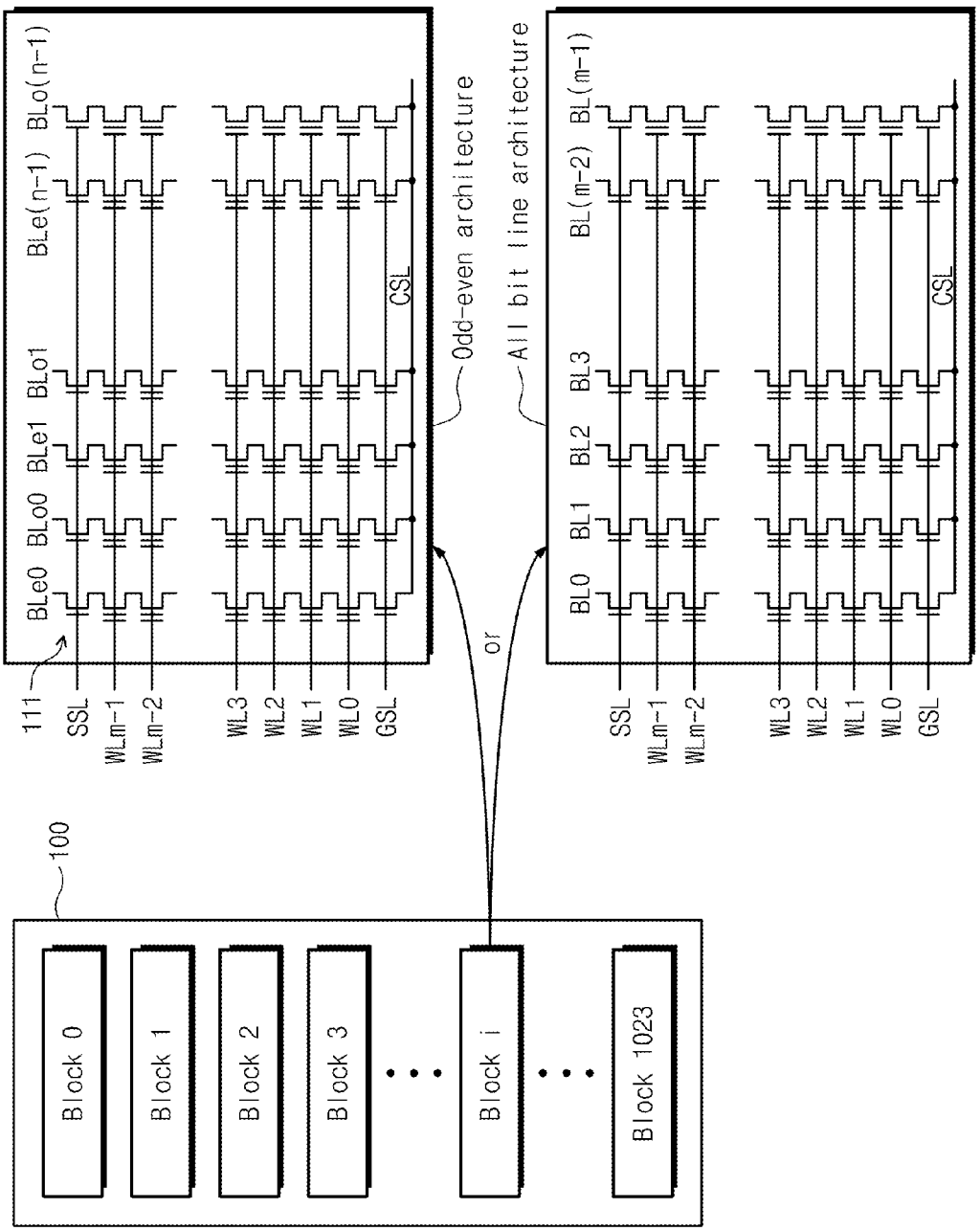
FIG. 3 is a diagram schematically illustrating a memory cell array having an all bit line memory architecture or an odd-even memory architecture.

FIG. 3 is a diagram schematically illustrating a memory cell array having the all bit line memory architecture or the odd-even memory architecture. Exemplary structures of a memory cell array 100 will be described. As one example, a NAND flash memory device including a memory cell array 100 partitioned into 1,024 blocks (Block 0~1023) will now be described. The data stored in each block may be simultaneously erased. In one embodiment, the memory block may be the minimum unit of storage elements that are simultaneously erased. Each memory block, for example, may have columns each corresponding to bit lines (e.g., bit lines of 1 KB) and row each corresponding to word lines WL0~WL(m−1). In one embodiment referred to as the all bit line (ABL) architecture, all the bit lines BL0~BL(m−1) of a memory block may be capable of being simultaneously selected during read and program operations. Storage elements in a common word line and connected to all bit lines may be capable of being programmed at the same time.

In an exemplary embodiment, a plurality of storage elements in the same column may be connected in series to form a NAND string 111. One end of the NAND string 111 may be connected to a corresponding bit line via a selection transistor which is controlled by a string selection line SSL, and the other end may be connected to a common source line CSL via a selection transistor which is controlled by a ground selection line GSL.

In another embodiment referred to as the odd-even architecture, bit lines may be divided into even bit lines (BLe0~BLe(n−1)) and odd bit lines (BLo0~BLe(n−1)). In the odd/even bit line architecture, storage elements in a common word line and connected to the odd bit lines may be programmed at a first point in time, while storage elements in the common word line and connected to even bit lines may be programmed at a second point in time. Data can be programmed and read into and from different blocks. Such operations are capable of being performed at the same time.

Figure 4:
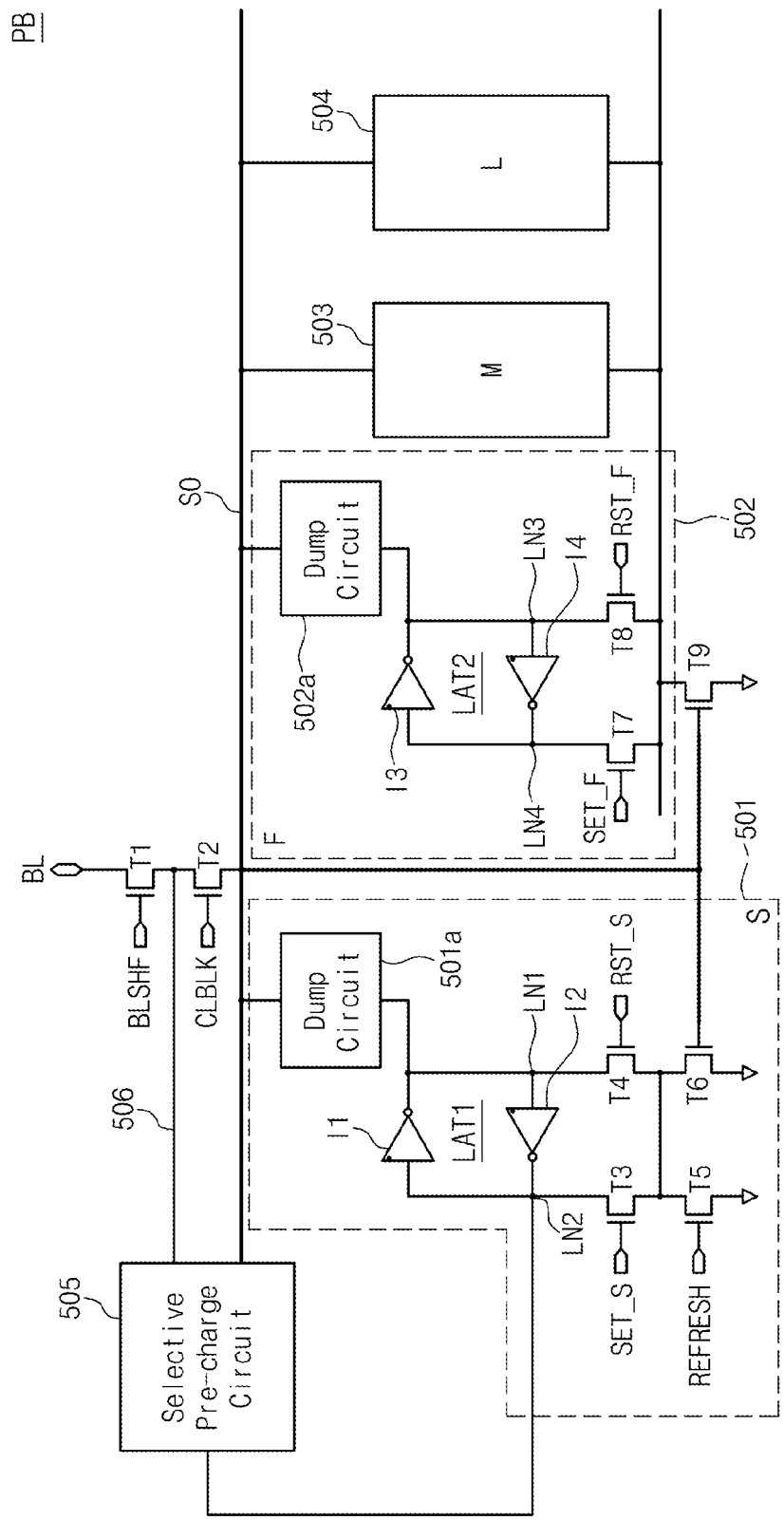
FIG. 4 is a block diagram schematically illustrating a page buffer according to an embodiment of the inventive concept.

FIG. 4 is a block diagram schematically illustrating a page buffer according to an embodiment of the inventive concept. FIG. 4 shows a page buffer PB of a read/write circuit 500 associated with a bit line.

Referring to FIG. 4, a page buffer PB may operate responsive to the control of control logic 400, and may include a plurality of, for example, four latch units 501, 502, 503, and 504, a selective pre-charge circuit 505, and a plurality of transistors T1, T2, and T9. The transistors T1 and T2 may be connected in series between a bit line BL and a sensing node SO. The transistors T1 and T2 may be controlled by corresponding control signals BLSLT and CLBLK, respectively.

The latch unit 501 may include a latch LAT1 formed of inverters I1 and I2, a dump circuit 501a, and a plurality of transistors T3 through T6. The transistors T3 and T5 may be connected in series between a latch node LN2 and a ground voltage, and may be controlled by corresponding control signals SET_S and REFRESH, respectively. The transistors T4 and T6 may be connected in series between a latch node LN1 and the ground voltage. The transistor T4 may be controlled by a control signal RST_S, and the transistor T6 may be controlled by a voltage of the sensing node SO. The dump circuit 501a may be configured to dump data retained by the latch LAT1 to the sensing node SO.

The latch unit 502 may include a latch LAT2 formed of inverters I3 and I4, a dump circuit 502b, and a plurality of transistors T7 and T8. The transistor T7 may be connected between a latch node LN4 and the transistor T9, and may be controlled by a control signal SET_F. The transistor T8 may be connected between a latch node LN3 and the transistor T9, and may be controlled by a control signal RST_F. The transistor T9 may be controlled by a voltage of the sensing node SO. The dump circuit 502b may be configured to transfer data retained by the latch LAT2 into the sensing node SO.

The remaining latch units 503 and 504 may be configured the same as the latch unit 502, and a description thereof may be thus omitted.

The selective pre-charge circuit 505 may be connected to the sensing node SO and to the bit line BL via a pre-charge path 506 and the transistor T1. The selective pre-charge circuit 505 may be configured to pre-charge the sensing node SO selectively according to a value latched by the latch unit 501. The selective pre-charge circuit 505 may supply a current to the pre-charge path 506 such that a pre-charged voltage of the bit line BL is maintained constantly. This will be more fully described later.

It is well understood that the page buffer PB and the number of latches included in the page buffer PB are not limited to the examples presented in this disclosure.

Figure 5:
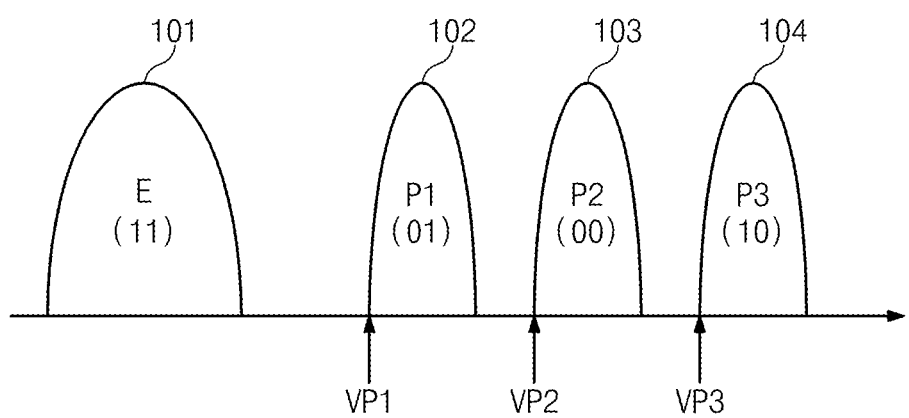
FIG. 5 is a diagram illustrating threshold voltage distributions of a nonvolatile memory device storing 2-bit data per cell.

FIG. 5 is a diagram illustrating threshold voltage distributions of a nonvolatile memory device storing 2-bit data per cell.

In the case where one memory cell stores 1-bit data, two threshold voltage distributions (e.g., threshold voltage distributions respectively corresponding to an erase state E and a program state P) may be formed. In the case where one memory cell stores 2-bit data, as illustrated in FIG. 5, four threshold voltages distributions, that is, threshold voltage distributions 101, 102, 103, and 104 respectively corresponding to an erase state E and three program states P1, P2, and P3 may be formed. Whether a memory cell is programmed to have a target program state may be determined using verification voltages VP1, VP2, and VP3 respectively corresponding to program states P1, P2, and P3. This may mean that a verification operation is executed three times using verification voltages VP1, VP2, and VP3 to store 2-bit data in a memory cell.

An interval between adjacent threshold voltage distributions may become narrower in proportion to an increase in the number of data bits being stored in a memory cell. As an interval between adjacent threshold voltage distributions becomes narrower, a read margin may be reduced. An interval between adjacent threshold voltage distributions may be widened by narrowing a width of each of threshold voltage distributions. This may be accomplished by a 2-step verification method. A conventional 2-step verification method is disclosed in U.S. Patent Publication No. 2011/0110154, the entirety of which is incorporated by reference herein. For the 2-step verification method, each of verification operations respectively corresponding to program states may include a first sensing operation and a second sensing operation. During the first sensing operation, a voltage variation of a sensing node may be sensed with one (e.g., a pre-verification voltage lower in level than a target verification voltage) of two different verification voltages applied to a selected word line. During the second sensing operation, a voltage variation of the sensing node may be sensed with the other (e.g., a fine-verification voltage being the target verification voltage) of the two different verification voltages applied to the selected word line. For the 2-step verification method, each sensing operation of a verification operation on one program state may include pre-charging a bit line and supplying a verification voltage to a selected word line. Most of a time taken to execute the verification operation may be occupied by pre-charging of the bit line. As the number of data bits being stored in a memory cell increases, the number of verification operations executed to confirm a program state may increase. This may mean that a read/program time (or, a response time to a read/write request of a host) increases in proportion to an increase in the number of data bits being stored in a memory cell.

As will be described later, for the inventive concept, a sensing operation may be continuously performed two times to determine each program state. In this case, a verification voltage applied to a word line may not be varied. In particular, when a sensing operation is continuously performed two times, an initially pre-charged state of a bit line may be maintained. That is, two sensing operations may necessitate one bit line pre-charging operation. For this reason, it is possible to reduce a read/program time (or, a response time to a read/write request of a host). Further, since a word line voltage is not varied during continuous sensing/latch operations, a time taken to set a word line voltage may be reduced.

Figure 6:
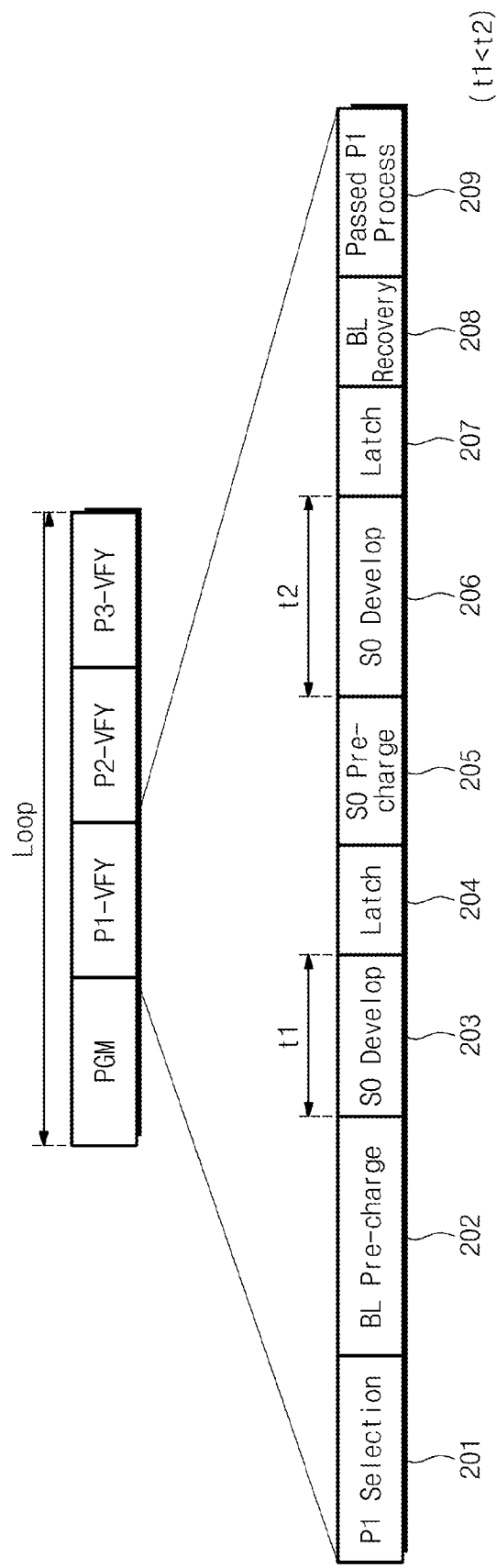
FIG. 6 is a diagram for describing a program method of a nonvolatile memory device according to an embodiment of the inventive concept.
Figure 7:
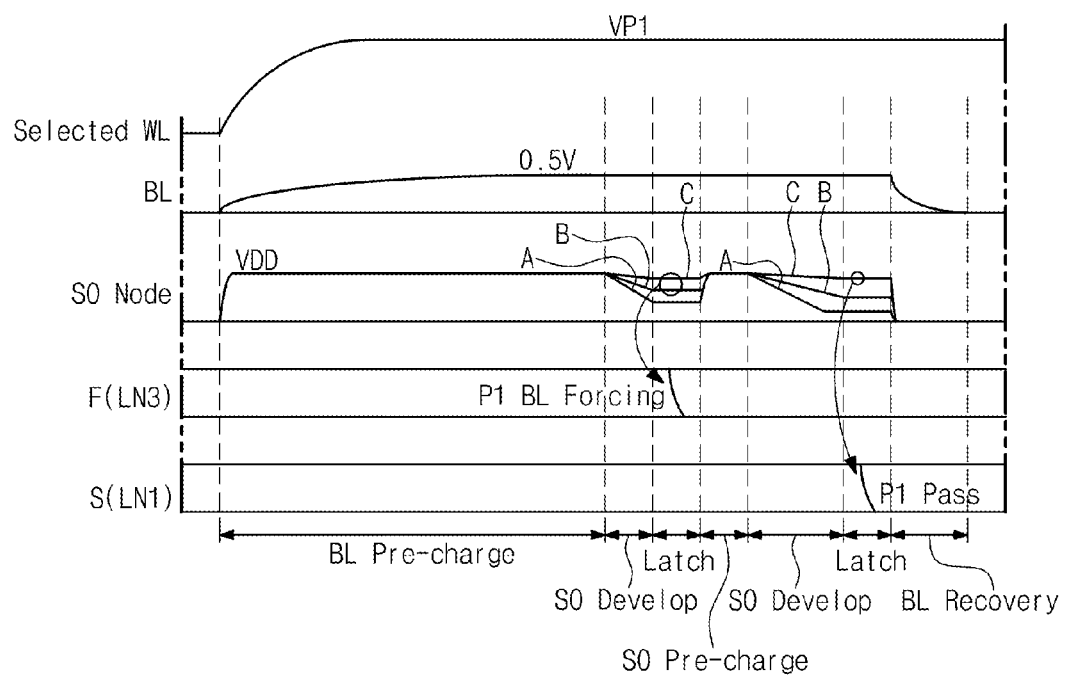
FIG. 7 is a timing diagram for describing a verification operation of a nonvolatile memory device according to an embodiment of the inventive concept.

FIG. 6 is a diagram for describing a program method of a nonvolatile memory device according to an embodiment of the inventive concept. FIG. 7 is a timing diagram for describing a verification operation of a nonvolatile memory device according to an embodiment of the inventive concept. Below, program and verification operations of a nonvolatile memory device according to an embodiment of the inventive concept will be more fully described with reference to accompanying drawings.

Prior to the description, it is assumed that 2-bit data is stored in one memory cell. With this assumption, when 2-bit data is stored in respective memory cells, as illustrated in FIG. 5, four threshold voltage distributions 101, 102, 103, and 104 may be formed. Memory cells may be programmed by iteration of program loops. A program loop may include a program period PGM and verification periods P1-VFY, P2-VFY, and P3-VFY as illustrated in FIG. 6. It is well understood that a program loop is iterated within a maximum program loop number.

Prior to programming of selected memory cells in which lower page data (e.g., LSB data) is stored, data (e.g., upper page data, or MSB data in the case of 2-bit data) to be stored in the selected memory cells may be loaded onto page buffers PB of a read/write circuit 500. Data loaded onto the page buffers PB may be stored in latch units 503 under the control of control logic 400. Data (e.g., lower page data) stored in the selected memory cells may be stored in latch units 504 under the control of the control logic 400. This may be made by an initial read operation. With the above-described operations, the latch units 503 and 504 of each of the page buffers PB respectively corresponding to the selected memory cells may be set to one of values (e.g., '11', '01', '00', and '10') respectively corresponding to erase and program states E, P1, P2, and P3 as illustrated in the following Table 1. Afterwards, the selected memory cells may be programmed according to data established in the page buffers PB. The selected memory cells may be programmed by supplying a selected word line and supplying bit lines with a power supply voltage or a ground voltage. A program voltage may be sequentially increased by a given increment according to iteration of program loops.

TABLE 1

|            | E | P1 (A/B/C) | P2 | P3 |
|------------|---|------------|----|----|
| S-LN1(501) | 0 | 1/1/1      | 0  | 0  |
| F-LN3(502) | 1 | 1/1/1      | 1  | 1  |
| M(503)     | 1 | 0/0/0      | 0  | 1  |
| L(504)     | 1 | 1/1/1      | 0  | 0  |

In Table 1, 'A', B', and 'C' may indicate memory cells to be programmed to have threshold voltages of a program state corresponding to a read voltage Vwl2 as illustrated in FIG. 1.

After the program operation is executed, as illustrated in FIG. 6, verification operations P1-VFY, P2-VFY, and P3-VFY may be continuously performed to determine whether the selected memory cells are programmed to have target threshold voltages (corresponding to program states P1, P2, and P3). First, a verification operation may be carried out with respect to memory cells to be programmed to the program state P1. The verification operation P1-VFY, as illustrated in FIG. 6, may include a P1 state selection period 201, a bit line pre-charge period 202, a sensing node develop period 203, a latch period 204, a sense node pre-charge period 205, a sense node develop period 206, a latch period 207, a bit line recovery period 208, and a passed P1 state process period 209.

In the P1 state selection period 201, latch nodes LN1 of latch units 501 corresponding to memory cells to be programmed to the program state P1 may be set to '1' based on latch values '01' of the latch units 503 and 504. As understood from the Table 1, latch nodes LN1 of latch units 501 corresponding to memory cells to be programmed to the remaining states E, P2, and P3 may be maintained with '0' being an initial state. Following the P1 state selection period 201, referring to FIG. 7, a verification voltage VP1 may be applied to the selected word line. The verification voltage VP1 may be a voltage corresponding to a target verification voltage (or, a target threshold voltage) of the program state P1.

During the bit line pre-charge period 202, bit lines may be selectively pre-charged according to latch values of the latch units 501. For example, in the case where the latch node LN1 of the latch unit 501 is set to '1' being a value indicating a memory cell to be programmed to the program state P1, a bit line may be pre-charged with a given voltage (e.g., 0.5V) by a selective pre-charge circuit 505. A sensing node SO may be pre-charged with a power supply voltage VDD at the bit line pre-charge period 202. In the case where the latch node LN1 of the latch unit 501 is set to '0', a bit line may be grounded via the selective pre-charge circuit 505. Thus, during the bit line pre-charge period 202, bit lines may be selectively pre-charged according to latch values of the latch units 501.

For the sensing node develop period 203, supplying of a current to the sensing node SO from the selective pre-charge circuit 505 may be blocked, and transistors T1 and T2 may be turned on. With this condition, a pre-charged voltage of the sensing node SO may be varied according to a threshold voltage of a selected memory cell. For example, as illustrated in FIG. 7, the sensing nodes SO may be developed along different slopes based on threshold voltages of selected memory cells (e.g., A, B, and C in FIG. 1). The sensing node SO corresponding to the selected memory cell A may be developed rapidly, while the sensing node SO corresponding to the selected memory cell C may be hardly developed. Since a difference between a threshold voltage of the selected memory cell B and the verification voltage VP1 is not large, the selected memory cell B may be determined to be an on cell or as an off cell according to a develop time. For the inventive concept, a develop time of the sensing node develop period 203 may be decided such that the selected memory cell B is determined to be an off cell on the basis of the verification voltage VP1. A develop time t1 may be decided such that a memory cell having a threshold voltage between read voltages Vwl1 and Vwl2 in FIG. 1 is determined to be an off cell.

In an embodiment, during the sensing node develop period 203, a bit line may be driven via a pre-charge path 506 under the condition that supplying of a current to the sensing node SO from the selective pre-charge circuit 505 is blocked. In other words, as illustrated in FIG. 7, a bit line may maintain the pre-charged voltage during the sensing node develop period 203.

At the latch period 204 following the sensing node develop period 203, a latch operation may be performed via the latch units 502. For example, a control signal RST_F may be activated with the transistor T2 turned off. At this time, if a voltage of the sensing node SO is higher than a threshold voltage of a transistor T9, a value of the latch node LN3 may be switched into '0' from '1'. If a voltage of the sensing node SO is lower than the threshold voltage of the transistor T9, a value of the latch node LN3 may be maintained with '1'. For the memory cells B and C in FIG. 1, as illustrated in the following Table 2, a value of the latch node LN3 may be changed into '0'. That is, a memory cell C having a threshold voltage higher than the verification voltage VP1 and a memory cell B having a threshold voltage lower than the verification voltage VP1 may be detected/determined.

TABLE 2

|            | E | P1 (A/B/C) | P2 | P3 |
|------------|---|------------|----|----|
| S-LN1(501) | 0 | 1/1/1      | 0  | 0  |
| F-LN3(502) | 1 | 1/0/0      | 1  | 1  |
| M(503)     | 1 | 0/0/0      | 0  | 1  |
| L(504)     | 1 | 1/1/1      | 0  | 0  |

In an embodiment, during the latch period 204, a bit line may be driven via the pre-charge path 506 with the transistor T2 turned off.

The sensing node SO may be pre-charged at the sensing node pre-charge period 205 following the latch period 204. This may be made by the selective pre-charge circuit 505.

For the sensing node develop period 206, supplying of a current to the sensing node SO from the selective pre-charge circuit 505 may be blocked, and the transistors T1 and T2 may be turned on. With this condition, a pre-charged voltage of the sensing node SO may be varied according to a threshold voltage of a selected memory cell. For example, as illustrated in FIG. 7, the sensing nodes SO may be developed along different slopes based on threshold voltages of selected memory cells (e.g., A, B, and C in FIG. 1). The sensing node SO corresponding to the selected memory cell A may be developed rapidly, while the sensing node SO corresponding to the selected memory cell C may be hardly developed. A develop time t2 may be decided such that memory cells each having a threshold voltage lower than the verification voltage VP1 is determined to be an on cell (or, memory cells each having a threshold voltage higher than the verification voltage VP1 is determined to be an off cell).

In an embodiment, during the sensing node develop period 206, a bit line may be driven via the selective pre-charge circuit 505 under the condition that supplying of a current to the sensing node SO from the selective pre-charge circuit 505 is blocked. In other words, as illustrated in FIG. 7, a bit line may maintain the pre-charged voltage during the sensing node develop period 206.

At the latch period 207 following the sensing node develop period 206, a latch operation may be performed via the latch units 501. For example, a control signal RST_S may be activated with the transistor T2 turned off. At this time, if a voltage of the sensing node SO is higher than a threshold voltage of a transistor T6, a value of the latch node LN1 may be switched into '0' from '1'. If a voltage of the sensing node SO is lower than the threshold voltage of the transistor T6, a value of the latch node LN1 may be maintained with '1'. For the memory cell C in FIG. 1, as illustrated in the following Table 3, a value of the latch node LN1 may be changed into '0'.

TABLE 3

|  | E | P1 (A/B/C) | P2 | P3 |
|---|---|---|---|---|
| S-LN1(501) | 0 | 1/1/1 | 0 | 0 |
| F-LN3(502) | 1 | 1/0/0 | 1 | 1 |
| M(503) | 1 | 0/0/0 | 0 | 1 |
| L(504) | 1 | 1/1/1 | 0 | 0 |

In an embodiment, during the latch period 207, a bit line may be driven via the selective pre-charge circuit 505 with the transistor T2 turned off.

At the bit line recovery period 208, voltages of bit lines may be discharged.

During the passed P1 state process period 209, a value of the latch unit 503 corresponding to a memory cell (e.g., C) having a threshold voltage higher than a read voltage VP1 may be set to '1'. For example, when latch values of the latch units 501 and 502 all are '0', as illustrated in the following Table 4, a value of the latch unit 503 may be set to '1'. This may mean that the memory cell C is program inhibited at a next program operation. That is, the memory cell C may be program passed.

TABLE 4

|  | E | P1 (A/B/C) | P2 | P3 |
|---|---|---|---|---|
| S-LN1(501) | 0 | 1/1/0 | 0 | 0 |
| F-LN3(502) | 1 | 1/0/0 | 1 | 1 |
| M(503) | 1 | 0/0/1 | 0 | 1 |
| L(504) | 1 | 1/1/1 | 0 | 0 |

A value '0' stored in the latch unit 502 may be used to decide a voltage being supplied to a bit line at a next program operation. For example, in the case where a value of '0' (corresponding to a memory cell B) is stored in the latch unit 502, a bit line may be driven with a voltage (e.g., 1V) (referred to as a bit line forcing voltage) that is lower than a power supply voltage and higher than a ground voltage. Compared with the case that a bit line is driven with a ground voltage, a memory cell B of a bit line driven with the bit line forcing voltage may be programmed to be slower than a memory cell A. This may force a width of a threshold voltage distribution to be formed narrowly. During a next program period, a bit line may be driven with one of a power supply voltage, a ground voltage, and a bit line forcing voltage according to a latch value of the latch unit 502 and latch values of the latch units 503 and 504.

After the verification operation P1-VFY on the program state P1 is performed, the verification operation P2-VFY and P3-VFY on the program states P2 and P3 may be continuously performed. The verification operation P2-VFY and P3-VFY on the program states P2 and P3 may be substantially identical to the verification operation P1-VFY except that a verification voltage applied to a selected word line is changed, and a description thereof is thus omitted.

In an embodiment, a transistor T7 may maintain a turn-off state at the verification periods P1-VFY, P2-VFY, and P3-VFY.

With the above description, it is possible to detect a memory cell (e.g., C) having a threshold voltage higher than a verification voltage, supplied to a word line, and a memory cell (e.g., B) having a threshold voltage lower than the verification voltage without a variation in the verification voltage. This may mean that a setup time required to vary a word line voltage is unnecessary. Further, upon execution of continuous sensing operations, a voltage of a bit line may be maintained constantly (or, with a pre-charged voltage). That is, it is possible to reduce a time taken to pre-charge a bit line before the sensing node develop period 206. Thus, a read/program time (or, a response time to a read/write request of a host) may be shortened.

In an embodiment, a 2-step verification scheme according to the inventive concept may be applied to a Single-Level Cell (SLC) as well as a Multi-Level Cell (MLC).

In an embodiment, a time t1 corresponding to a sensing node develop period executed before the sensing node pre-charge period 205 may be set to be shorter than a time t2 corresponding to a sensing node develop period executed after the sensing node pre-charge period 205. In this case, the time t1 corresponding to a sensing node develop period executed before the sensing node pre-charge period 205 may be decided such that a memory cell having a threshold voltage lower than a read voltage is determined to be an on cell, and the time t2 corresponding to a sensing node develop period executed after the sensing node pre-charge period 205 may be decided such that a memory cell having a threshold voltage lower by a predetermined voltage than the read voltage is determined to be an off cell.

Figure 8:
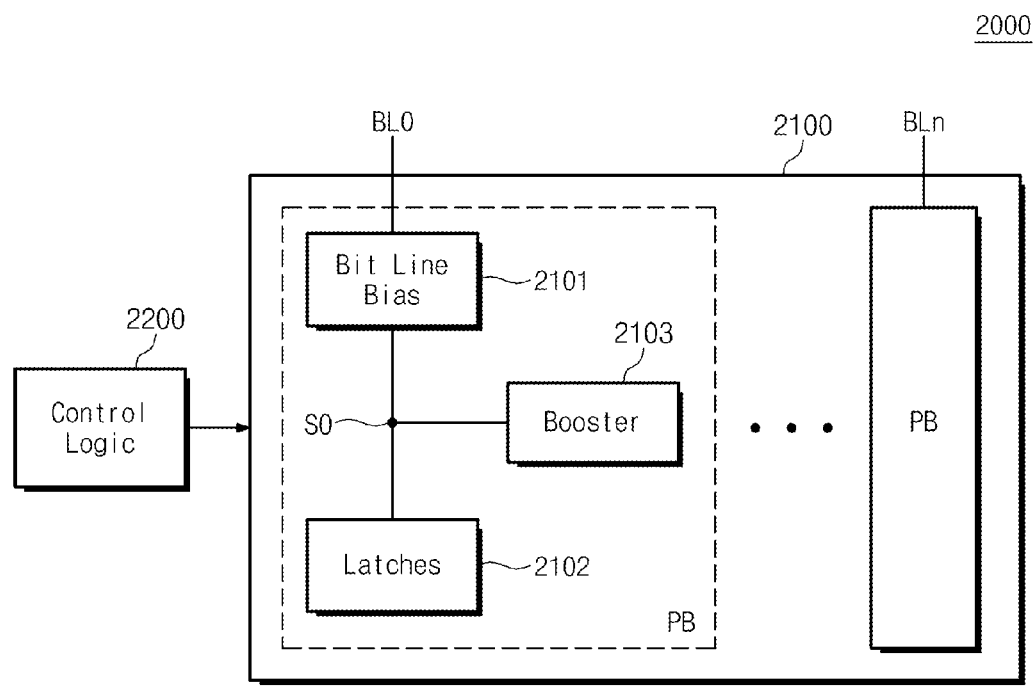
FIG. 8 is a block diagram schematically illustrating a nonvolatile memory device according to another embodiment of the inventive concept.

FIG. 8 is a block diagram schematically illustrating a nonvolatile memory device according to another embodiment of the inventive concept. Referring to FIG. 8, a nonvolatile memory device 2000 may include a read/write circuit 2100 and control logic 2200. Although not shown in FIG. 8, it is well understood that the nonvolatile memory device 200 further includes a memory cell array 100, a row selector circuit 200, a voltage generator circuit 300, an input/output circuit 600, and the like as is illustrated in FIG. 2.

The read/write circuit 2100 may be connected to a memory cell array via bit lines BL0 through BLn. The read/write circuit 2100 may include page buffers PB connected to the bit lines BL0 through BLn, respectively. In another embodiment, it is well understood that the read/write circuit 2100 is formed of page buffers PB respectively connected to bit line pairs. Each page buffer PB may include a bit line bias block 2101, a latch block 2102, and a booster 2103. The bit line bias block 2101 may be formed of a selective pre-charge circuit 505 and transistors T1 and T2 as is illustrated in FIG. 4, and the latch block 2102 may be formed of latch units 501 through 504 and a transistor T9 as is illustrated in FIG. 4. Thus, a description associated with the bit line bias block 2101 and the latch block 2102 may be omitted. The booster 2103 of the page buffer PB may be configured to boost a voltage of a sensing node SO under the control of the control logic 2200. With an embodiment, the booster 2103 may boost a voltage of the sensing node SO before one of continuous sensing/latch operations of each verification operation. This will be more fully described later.

Figure 9:
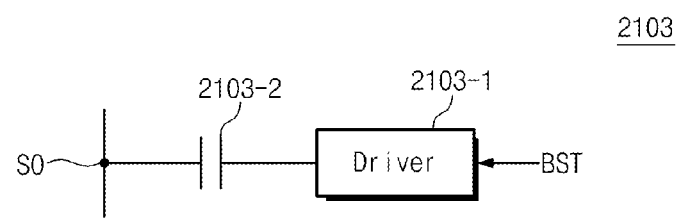
FIG. 9 is a diagram schematically illustrating a booster in FIG. 8 according to an embodiment of the inventive concept.

FIG. 9 is a diagram schematically illustrating a booster shown in FIG. 8 according to an embodiment of the inventive concept.

Referring to FIG. 9, a booster 2103 may include a driver 2103-1 and a capacitor 2103-2. The driver 2103-1 may drive one end of the capacitor 2103-2 in response to a boosting signal BST. The capacitor 2103-2 may be connected between a sensing node SO and the driver 2103-1. A voltage of the sensing node SO may be boosted via the capacitor 2103-2 at a low-to-high transition of the boosting signal BST. In an embodiment, the capacitor 2103-2 may be formed of a MOS transistor. In another embodiment, the capacitor 2103-2 may be formed using the sensing node SO and an adjacent signal line. That is, the capacitor 2103-2 may be formed of the sensing node S0 used as one electrode, an adjacent signal line used as the other electrode, and an insulation material between the sensing node SO and the signal line. It is well understood that utilization the capacitor 2103-2 is not limited to this disclosure.

Figure 10:
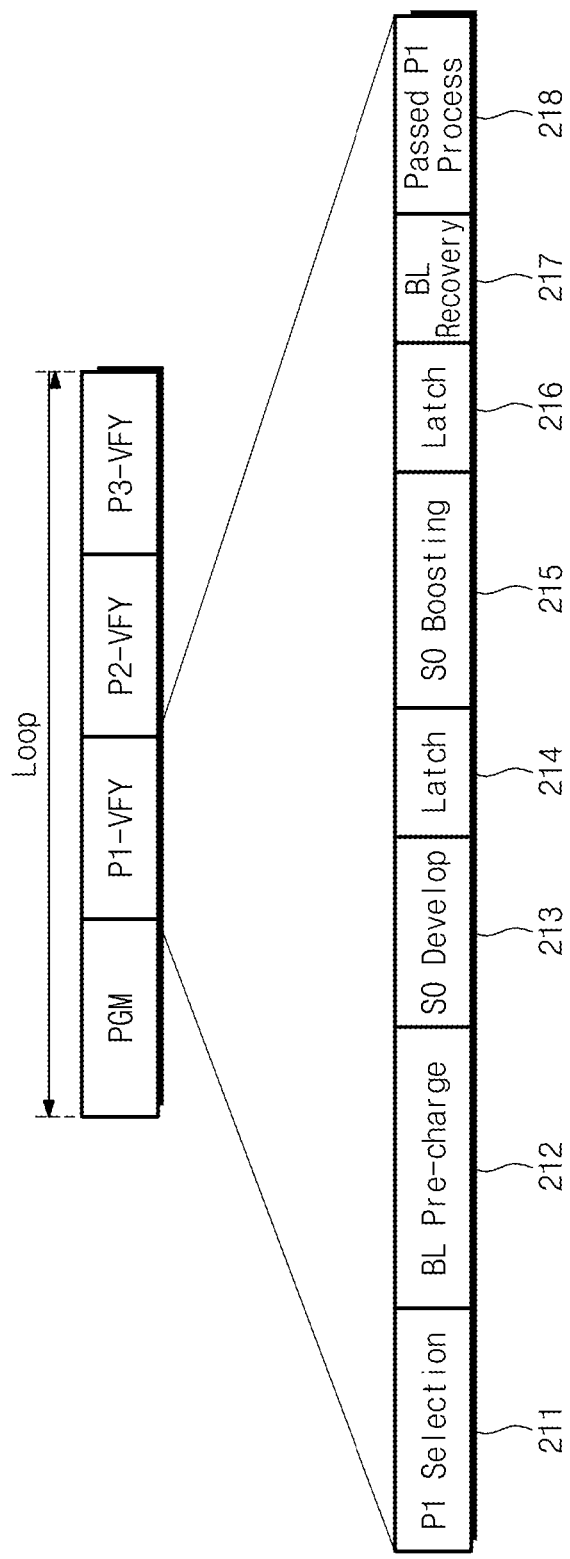
FIG. 10 is a diagram for describing a program method of a nonvolatile memory device according to another embodiment of the inventive concept.
Figure 11:
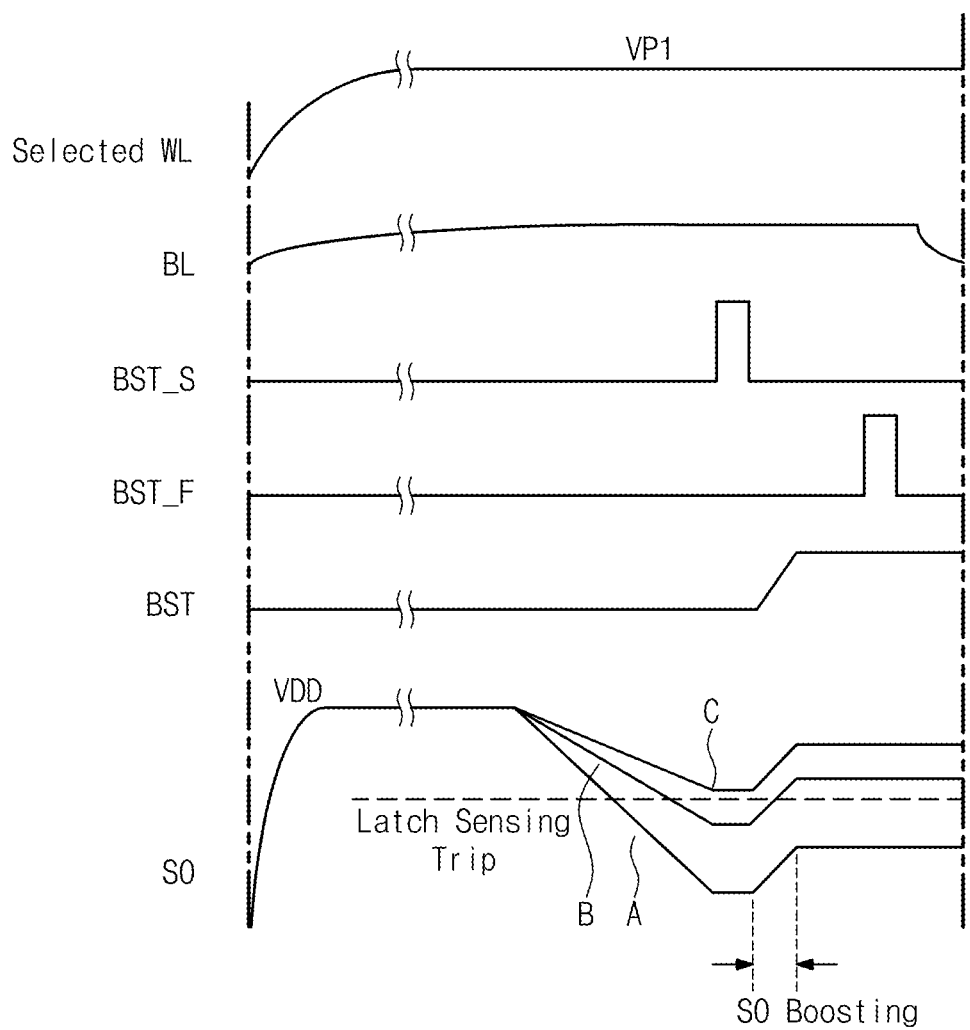
FIG. 11 is a timing diagram for describing a verification operation of a nonvolatile memory device according to another embodiment of the inventive concept.

FIG. 10 is a diagram for describing a program method of a nonvolatile memory device according to another embodiment of the inventive concept. FIG. 11 is a timing diagram for describing a verification operation of a nonvolatile memory device according to another embodiment of the inventive concept. Below, program and verification operations of a nonvolatile memory device according to another embodiment of the inventive concept will be more fully described with reference to accompanying drawings.

A program loop may include a program period PGM and verification periods P1-VFY, P2-VFY, and P3-VFY as illustrated in FIG. 10. The program period PGM may be the same or substantially the same as that described in relation to FIG. 6, and a description thereof is thus omitted.

After the program operation is executed, as illustrated in FIG. 10, verification operations P1-VFY, P2-VFY, and P3-VFY may be continuously performed to determine whether the selected memory cells are programmed to have target threshold voltages. First, a verification operation may be carried out with respect to memory cells to be programmed to the program state P1. The verification operation P1-VFY, as illustrated in FIG. 10, may include a P1 state selection period 211, a bit line pre-charge period 212, a sensing node develop period 213, a latch period 214, a sense node boosting period 215, a latch period 216, a bit line recovery period 217, and a passed P1 state process period 218.

Operations of the P1 state selection period 211 and the bit line pre-charge period 212 may be the same or substantially the same as that described in relation to FIG. 6, and a description thereof is thus omitted.

An operation of the sensing node develop period 213 may be substantially identical to a sensing node develop period 206 described in relation to FIG. 6. That is, as illustrated in FIG. 11, a sensing node develop period may be made during a develop time t2 which is decided such that memory cells (e.g., A and B) having threshold voltages lower than a verification voltage VP1 are detected as an on cell. During the develop time t2, a memory cell C having a threshold voltage higher than the verification voltage VP1 may be detected.

In an embodiment, during the sensing node develop period 213, a bit line may be driven via a pre-charge path 506 under the condition that supplying of a current to the sensing node SO from a selective pre-charge circuit 505 is blocked. In other words, as illustrated in FIG. 11, a bit line may maintain the pre-charged voltage during the sensing node develop period 213.

At the latch period 214 following the sensing node develop period 213, a latch operation may be performed via the latch units 501. For example, a control signal RST_S may be activated with a transistor T2 turned off. At this time, if a voltage of the sensing node SO is higher than a threshold voltage of a transistor T6, a value of the latch node LN1 may be switched into '0' from '1'. If a voltage of the sensing node SO is lower than the threshold voltage of the transistor T6, a value of the latch node LN1 may be maintained with '1'.

During the sensing node boosting period 215, a voltage of the sensing node SO may be boosted via a booster 2103 under the control of control logic 2200. As illustrated in FIG. 11, a voltage of the sensing node SO may be boosted such that a memory cell (e.g., B) having a threshold voltage lower than the verification voltage VP1 is determined to be an off cell (or, a threshold voltage of a memory cell B lower than the verification voltage VP1 is increased to be higher than a latch sensing trip point). A boosting level of the sensing node SO may be variable according to a voltage of a boosting signal BST applied to the booster 2103.

At the latch period 216 following the sensing node boosting period 215, a latch operation may be performed via the latch units 502. For example, a control signal RST_F may be activated with the transistor T2 turned off. At this time, if a voltage of the sensing node SO is higher than a threshold voltage of a transistor T9, a value of the latch node LN3 may be switched to '0' from '1'. If a voltage of the sensing node SO is lower than the threshold voltage of the transistor T9, a value of the latch node LN3 may be maintained with '1'. For the memory cell C in FIG. 1, a value of the latch node LN3 may be changed into '0'.

The bit line recovery period 217 and the passed P1 state process period 218 may be the same or substantially the same as that described in relation to FIG. 6, and a description thereof is thus omitted.

As described above, a value '0' stored in the latch unit 502 may be used to decide a voltage to be supplied to a bit line at a next program operation. For example, In the case where a value of '0' (corresponding to a memory cell B) is stored in the latch unit 502, a bit line may be driven with a voltage (e.g., 1V) (referred to as a bit line forcing voltage) that is lower than a power supply voltage and higher than a ground voltage. Compared with the case where a bit line is driven with a ground voltage, a memory cell B of a bit line driven with the bit line forcing voltage may be programmed to be slower than a memory cell A. This may force a width of a threshold voltage distribution to be formed narrowly.

After the verification operation P1-VFY on the program state P1 is performed, the verification operation P2-VFY and P3-VFY on the program states P2 and P3 may be continuously performed. The verification operation P2-VFY and P3-VFY on the program states P2 and P3 may be substantially identical to the verification operation P1-VFY except that a verification voltage applied to a selected word line is changed, and a description thereof is thus omitted.

With the above description, it is possible to detect a memory cell (e.g., C) having a threshold voltage higher than a verification voltage, supplied to a word line, and a memory cell (e.g., B) having a threshold voltage lower than the verification voltage without a variation in the verification voltage. This may mean that a setup time required to vary a word line voltage is unnecessary. Further, upon execution of continuous sensing operations, a voltage of a bit line may be maintained constantly (or, with a pre-charged voltage). That is, it is possible to reduce a time taken to pre-charge a bit line before detecting the memory cell B. Thus, a read/program time (or, a response time to a read/write request of a host) may be shortened. Further, since a word line voltage is not varied during continuous sensing operations, a time required to set a word line voltage may be reduced.

A sensing scheme according to embodiments of the inventive concept may be applied to read operations (e.g., a data recover read operation, a soft-decision read operation, a read retry operation, etc.) which are distinguished from the above-described 2-step verification operation. This will be more fully described later.

Figure 12:
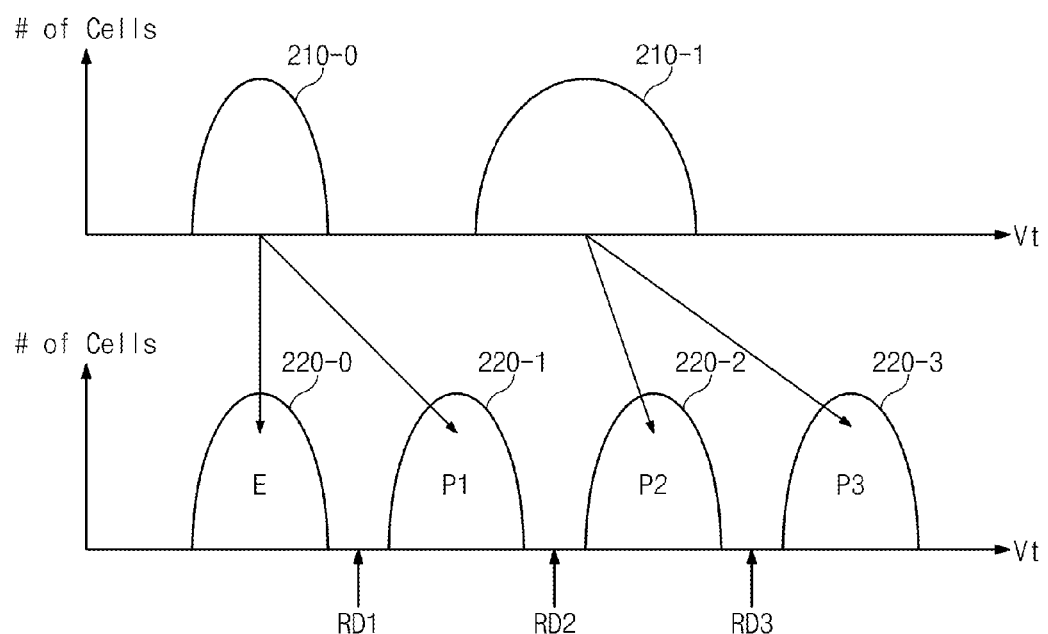
FIG. 12 is a diagram for describing a program method for reducing word line coupling.

FIG. 12 is a diagram for describing a program method for reducing the word line coupling.

In FIG. 12, there is illustrated a program method for reducing the word line coupling which will be performed under the assumption that each memory cell stores 2-bit data. In FIG. 12, curves 210-0 and 210-1 illustrate threshold voltage distributions for memory cells after lower page programming, and curves 220-0, 220-1, 220-2, and 220-3 illustrate threshold voltage distributions for memory cells after upper page programming.

After lower and upper pages are programmed, as illustrated in FIG. 12, memory cells may have any one of four data states E, P1, P2, and P3. In the case of a method illustrated in FIG. 12, memory cells in the threshold voltage distribution 210-0 may be programmed to a threshold voltage distribution 220-0 or a threshold voltage distribution 220-1 after the lower page programming Memory cells in the threshold voltage distribution 210-1 may be programmed to a threshold voltage distribution 220-2 or a threshold voltage distribution 220-3 after the lower page programming. The threshold voltage distributions 220-0, 220-1, 220-2, and 220-3 may be discriminated using read voltages RD1, RD2, and RD3.

If M-bit data (M being an integer of 2 or more) is stored in each memory cell, threshold voltages of memory cells of an nth word line may be shifted when an upper page is programmed at memory cells of a (n+1)th word line. That is, threshold voltage distributions of memory cells of the nth word line may widen due to word line coupling as compared to the threshold voltage distribution width before the upper page is programmed at memory cells of the (n+1)th (or, upper) word line. A threshold voltage distribution may widen because memory cells of the nth word line selectively experience word line coupling when the upper page is programmed at memory cells of the (n+1)th word line.

In some embodiments, among memory cells of the (n+1)th word line, memory cells (or, called aggressor cells) forcing the coupling to memory cells of the nth word line may constitute one or more aggressor cell groups according to a program manner and/or a size (degree) of the coupling forced to the memory cells of the nth word line. Likewise, among memory cells of the (n+1)th word line, memory cells not forcing the coupling to memory cells of the nth word line may constitute one group. The remaining memory cells among the memory cells of the (n+1)th word line other than the aggressor cells may be defined as non-aggressor cells. The aggressor and non-aggressor cells may have any one of program states described in FIG. 12, respectively. By this definition, memory cells of the nth word line may be formed of coupled memory cells and uncoupled memory cells. For this reason, a threshold voltage distribution widens, which will be more fully described below. A program operation on the (n+1)th word line forcing the word line coupling to memory cells of the nth word line may be determined variably according to an address scramble technique.

Figure 13:
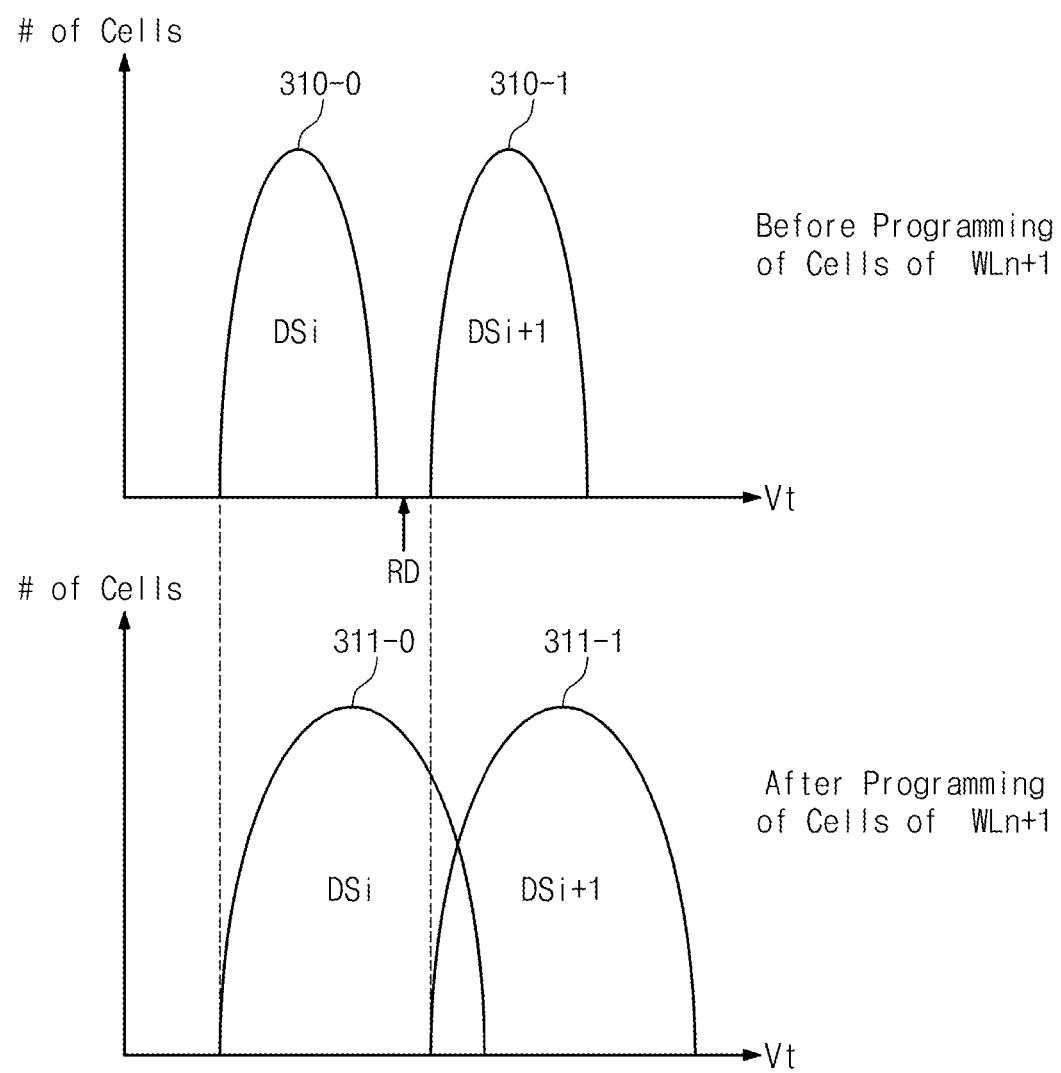
FIG. 13 is a diagram illustrating threshold voltage distributions associated with memory cells of an nth word line before and after word line coupling is caused when memory cells of a (n+1)th word line are programmed.

FIG. 13 is a diagram illustrating threshold voltage distributions associated with memory cells of an nth word line before and after word line coupling caused when memory cells of a (n+1)th word line are programmed.

An example in FIG. 13 illustrates two adjacent threshold voltage distributions 230-0 and 230-1 associated with memory cells of an nth word line before programming of memory cells of a (n+1)th word line, that is, before word line coupling. In FIG. 13, there are illustrated two threshold voltage distributions. But, it is well understood that more threshold voltage distributions are provided according to a bit number per cell. The number of threshold voltage distributions may be determined according to the number of data bits of stored in a memory cell. For example, when m-bit data (m being 2 or more integer) is stored in a memory cell, $2^m$ threshold voltage distributions may be provided. Threshold voltage distributions 310-0 and 310-1 may be determined using a read voltage RD between threshold voltage distributions 310-0 and 310-1. Although not shown in figures, remaining threshold voltage distributions may be determined using a read voltage between adjacent threshold voltage distributions. This read operation is referred to as a normal read operation, and a read voltage RD used at the normal read operation is referred to as a normal read voltage.

Threshold voltage distributions 231-0 and 231-1 illustrated in FIG. 13 show threshold voltage distributions associated with memory cells of the nth word line after experiencing word line coupling which is caused when memory cells of the (n+1)th word line are programmed. The threshold voltage distributions 231-0 and 231-1 may include threshold voltage distributions associated with memory cells experiencing word line coupling and memory cells not experiencing word line coupling when memory cells of the (n+1)th word line are programmed.

Figure 14:
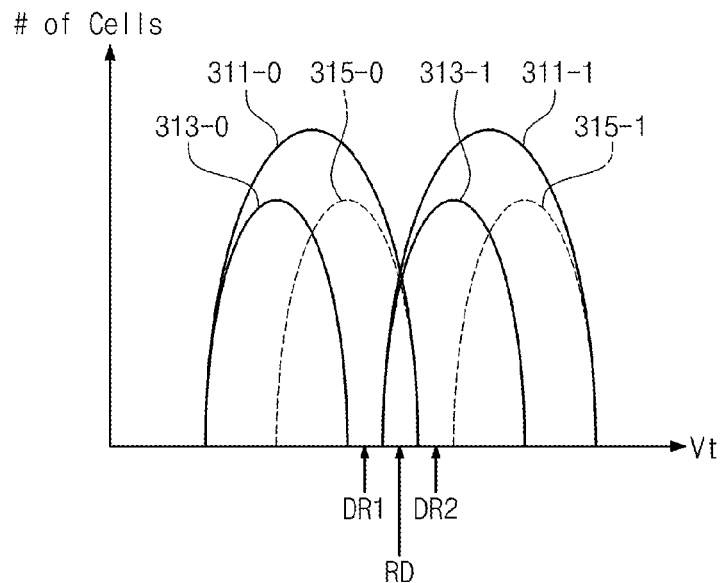
FIG. 14 is a diagram illustrating all threshold voltage distributions in FIG. 13 including coupled and uncoupled memory cells.

FIG. 14 is a diagram illustrating all threshold voltage distributions in FIG. 13 including coupled and uncoupled memory cells.

In an example of FIG. 14, threshold voltage distributions 313-0 and 313-1 may illustrate threshold voltage distributions of memory cells (or, uncoupled memory cells) which do not experience a threshold voltage shift due to word line coupling. Threshold voltage distributions 315-0 and 315-1 may illustrate threshold voltage distributions of memory cells (or, coupled memory cells) which experience a threshold voltage shift due to word line coupling. That is, the threshold voltage distributions 315-0 and 315-1 may indicate a threshold voltage shift of memory cells which were programmed to data states 313-0 and 313-1.

Programmed memory cells of an nth word line may belong to uncoupled threshold voltage distributions 313-0 and 313-1 or to coupled threshold voltage distributions 315-0 and 315-1, based on a threshold voltage shift caused by programming of memory cells of the (n+1)th word line. As illustrated in FIG. 14, a read voltage DR1 may be used to read uncoupled memory cells, that is, to discriminate memory cells within threshold voltage distributions 313-0 and 313-1. A read voltage DR2 may be used to read coupled memory cells, that is, to discriminate memory cells within threshold voltage distributions 315-0 and 315-1.

Two read operations may be executed with respect to one threshold voltage distribution (or, a data state) (formed of a coupled distribution and an uncoupled distribution) using the read voltages DR1 and DR2 in order to reduce the read error caused by word line coupling. The number of read operations executed with respect to one data state may be determined according to the number of groups formed of aggressor cells (or, programs states causing coupling). For example, aggressor cells constitute one group or two or more groups. If aggressor cells constitute one group, a read operation may be carried out twice. If aggressor cells constitute two groups, a read operation may be carried out three times.

Referring to FIG. 14 which shows a read operation executed when aggressor cells constitute one group, a read operation using the read voltage DR1 may be performed to discriminate memory cells within the uncoupled distributions 313-0 and 313-1, and a read operation using the read voltage DR2 may be performed to discriminate memory cells within the coupled distributions 315-0 and 315-1. Memory cells to be read using the read voltage DR1 and memory cells to be read using the read voltage DR2 may be divided according to whether memory cells of an upper word line are programmed, which will be more fully described hereinafter. As a result, a read operation on memory cells of an upper word line of the selected word line, that is, of an adjacent word line, may be made previously before read operations on memory cells of a selected word line are made. The above-described read operations are called a data recover read operation, and the first and second read voltages DR1 and DR2 may be referred to as first and second data recover read voltages, respectively.

As described above, the data recover read operation may necessitate two read operations to discriminate memory cells included in different threshold voltage distributions. Each of the read operations may accompany an operation of pre-charging bit lines. For this reason, an overall read speed (or, a response speed to a read request of a host) may be lowered. However, it is possible to minimize lowering of an overall read speed (or, a response speed to a read request of a host) by applying a sensing scheme of the inventive concept described in relation to FIGS. 1 through 11 to the data recover read operation. This will be more fully described next.

Figure 15:
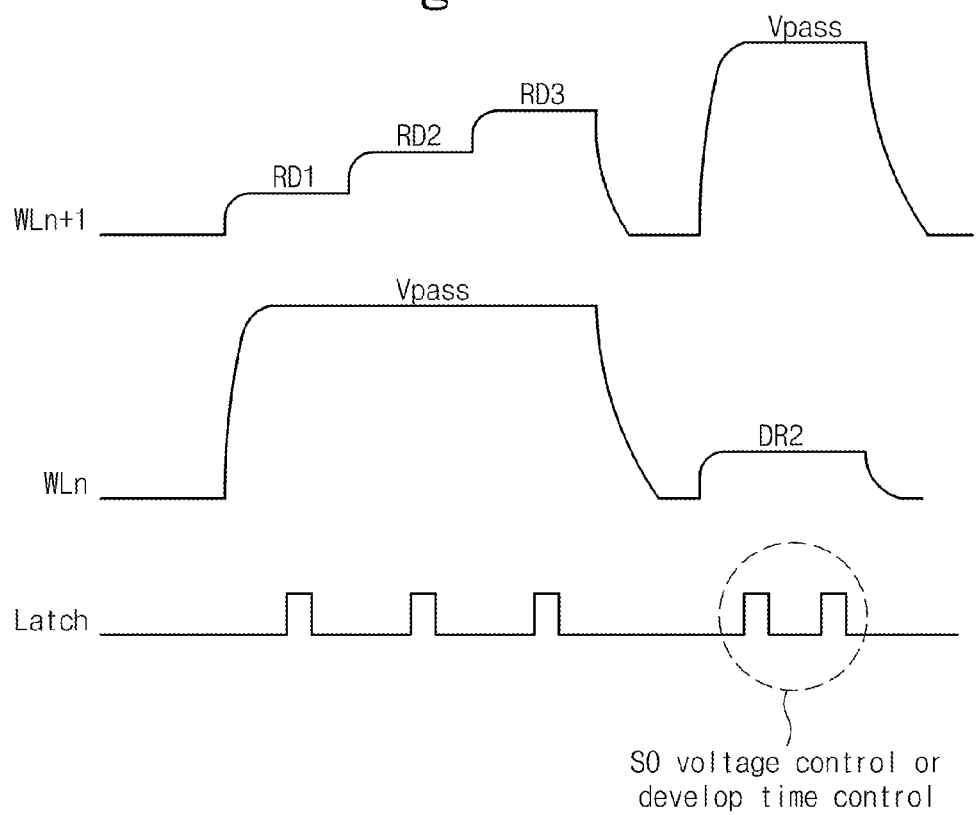
FIG. 15 is a timing diagram for describing a data recover read operation of a nonvolatile memory device according to an embodiment of the inventive concept.

FIG. 15 is a timing diagram for describing a data recover read operation of a nonvolatile memory device according to an embodiment of the inventive concept. Below, a data recover read operation of a nonvolatile memory device according to an embodiment of the inventive concept will be more fully described with reference to accompanying drawings.

Based on read voltages RD1, RD2, and RD3, data may be read out from memory cells connected to a word line (e.g., a (n+1)th word line) adjacent to a selected word line (e.g., an nth word line). The read data may be stored in a read/write circuit 500 of a nonvolatile memory device 1000. Data may be read out from memory cells connected to the selected word line, based on the data read from the memory cells of the adjacent word line. Unlike the above description, as illustrated in FIG. 15, sensing operations (or, latch operations) may be continuously performed with a read voltage DR2 supplied to a selected word line. Herein, sensing operations for discriminating distributions 313-0 and 313-1 and for discriminating distributions 315-0 and 315-1 may be performed using a develop time control scheme described in FIGS. 6 and 7 or using a sensing node boosting scheme described in FIGS. 10 and 11, and a description thereof is thus omitted.

With the above description, it is possible to discriminate memory cells having different threshold voltages without a variation in a word line voltage. This may mean that a setup time required to vary a word line voltage is unnecessary. Further, upon execution of continuous sensing operations, a voltage of a bit line may be maintained constantly (or, with a pre-charged voltage). That is, it is possible to reduce a time taken to pre-charge a bit line. Thus, a read/program time (or, a response time to a read/write request of a host) may be shortened. Further, since a word line voltage is not varied during continuous sensing operations, a time required to set a word line voltage may be reduced.

Figure 16:
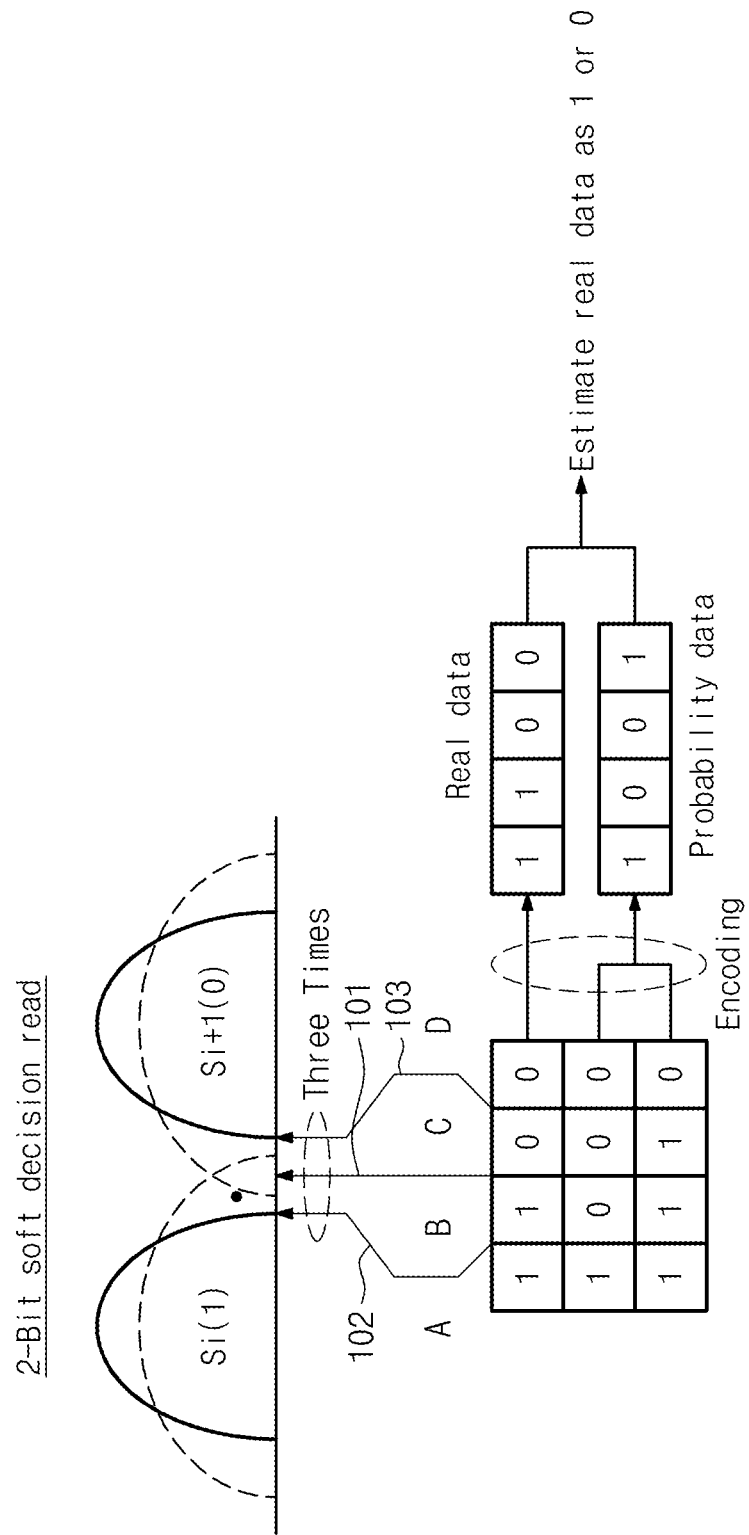
FIG. 16 is a diagram for describing a 2-bit soft-decision read method.

FIG. 16 is a diagram for describing a 2-bit soft-decision read method. Referring to FIG. 16, two states Si and Si+1 illustrated by a solid line may be discriminated by a read voltage 101. A read operation performed using the read voltage 101 may be referred to as a hard-decision read operation. If the states Si and Si+1 are varied as illustrated by a dotted line, it is difficult to discriminate the states Si and Si+1, illustrated by the dotted line, using the read voltage 101. Discrimination of the states Si and Si+1 of the dotted line may be made via a soft-decision read operation that is performed according to a soft-decision read command provided from an external device (e.g., a memory controller). For example, data of a memory cell illustrated by a black dot (•) may be determined by a 2-bit soft-decision read operation. An example of a soft-decision read method is disclosed in U.S. Pat. No. 7,800,954, the entirety of which is incorporated by reference herein.

As described in FIG. 16, the 2-bit soft-decision read operation may necessitate three sensing operations. Further, in the case where data read via the hard-decision read operation is applied to the 2-bit soft-decision read operation, the 2-bit soft-decision read operation may necessitate two sensing operations.

In an embodiment, it will be well understood that a manner of encoding data read by the 2-bit soft-decision read operation may be realized in a variety of different ways. Encoding may be made by a read/write circuit of a nonvolatile memory device 1000 according to the control of control logic 400, or may be made by an external device (e.g., a memory controller).

Figure 17:
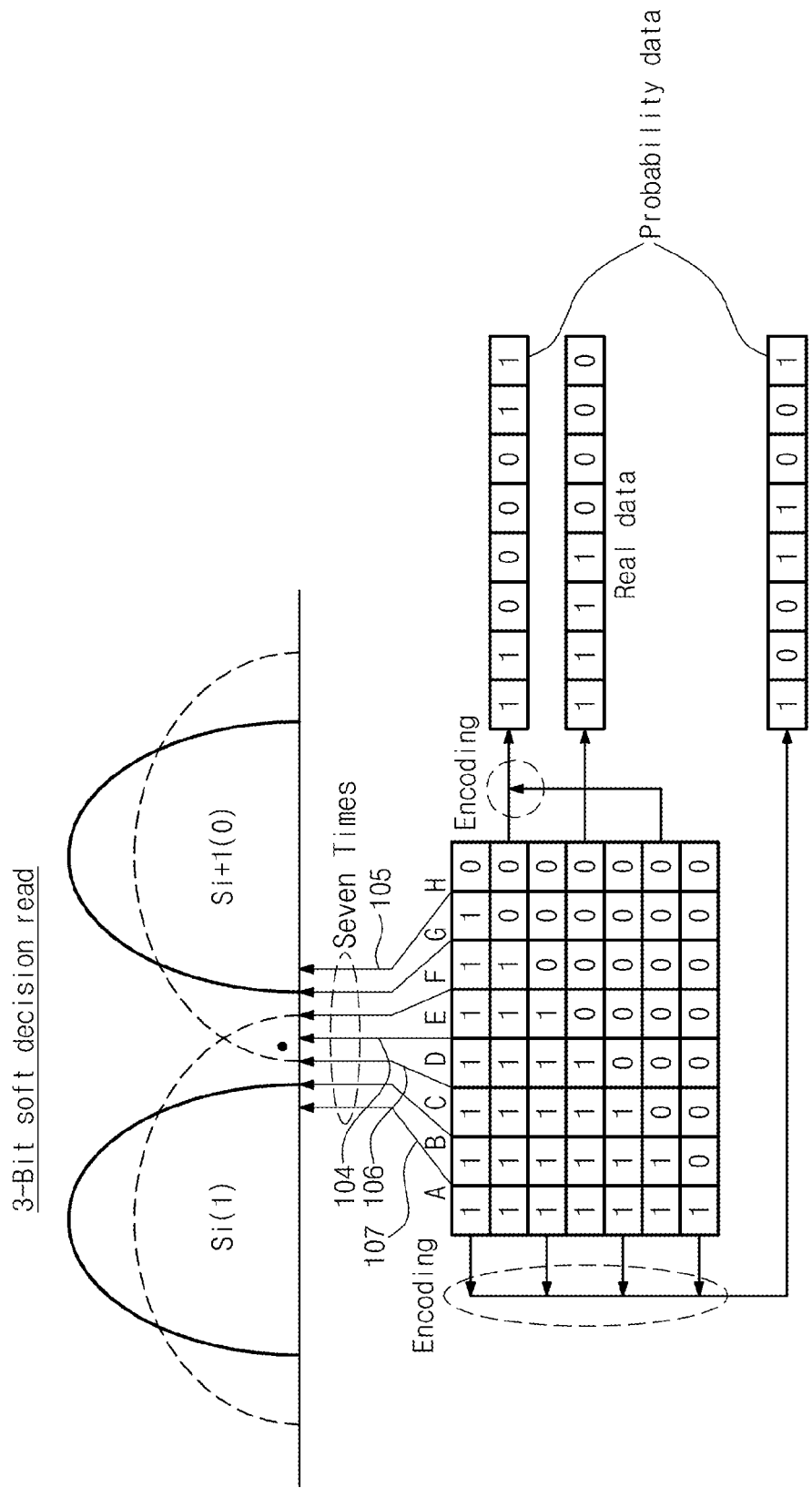
FIG. 17 is a diagram for describing a 3-bit soft-decision read method.

FIG. 17 is a diagram for describing a 3-bit soft-decision read method. Referring to FIG. 17, two states Si and Si+1 illustrated by a solid line may be discriminated by a read voltage 104. A read operation performed using the read voltage 104 may be referred to as a hard-decision read operation. If the states Si and Si+1 are varied as illustrated by a dotted line, it is difficult to discriminate the states Si and Si+1, illustrated by the dotted line, using the read voltage 104. Discrimination of the states Si and Si+1 of the dotted line may be made via a 3-bit soft-decision read operation that is performed according to a soft-decision read command provided from an external device (e.g., a memory controller). The 3-bit soft-decision read operation may necessitate seven sensing operations. Read data and probability data of an error may be generated by encoding data read by the seven sensing operations. The real data may be determined to be '1' or '0' according to the probability data of an error.

As described in FIG. 17, the 3-bit soft-decision read operation may necessitate seven sensing operations. Further, in the case where data read via the hard-decision read operation is applied to the 3-bit soft-decision read operation, the 3-bit soft-decision read operation may necessitate six sensing operations.

In an embodiment, it will be well understood that a manner of encoding data read by the 3-bit soft-decision read operation may be realized in a variety of different ways. Encoding may be made by a read/write circuit of a nonvolatile memory device 1000 according to the control of control logic 400, or may be made by an external device (e.g., a memory controller).

As described above, the soft-decision read operation may necessitate a plurality of read operations to discriminate memory cells having different threshold voltages. Each of the read operations may accompany an operation of pre-charging bit lines. For this reason, an overall read speed (or, a response speed to a read request of a host) may be lowered. However, it is possible to minimize lowering of an overall read speed (or, a response speed to a read request of a host) by applying a sensing scheme of the inventive concept described in relation to FIGS. 1 through 11 to the soft-decision read operation. This will be more fully described next.

Figure 18:
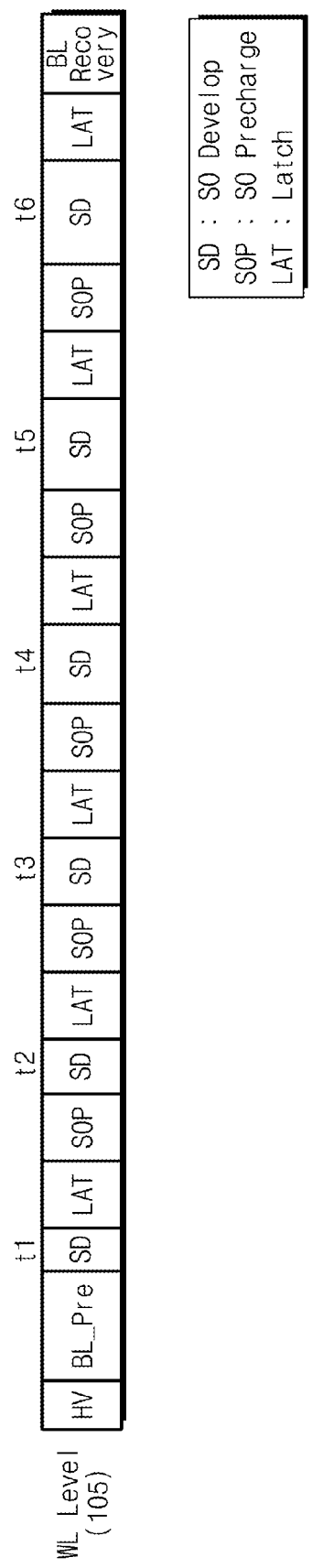
FIG. 18 is a diagram for describing a soft-decision read operation of a nonvolatile memory device according to an embodiment of the inventive concept.

FIG. 18 is a diagram for describing a soft-decision read operation of a nonvolatile memory device according to an embodiment of the inventive concept.

Referring to FIG. 18, a soft-decision read operation may include sensing operations which are continuously performed with a read voltage (e.g., 105 in FIG. 17) supplied to a selected word line. First, a bit line may be pre-charged. Then, latch operations may be carried out continuously using a develop time control scheme described in relation to FIG. 6. That is, develop times t1 through t6 respectively corresponding to sensing node develop periods may be set differently. A sensing node pre-charge operation may be performed prior to sensing node develop periods that are processed after a first sensing node develop period. It is possible to detect a threshold voltage of a memory cell without a variation in a read voltage applied to a word line and without an additional pre-charge operation.

Figure 19:
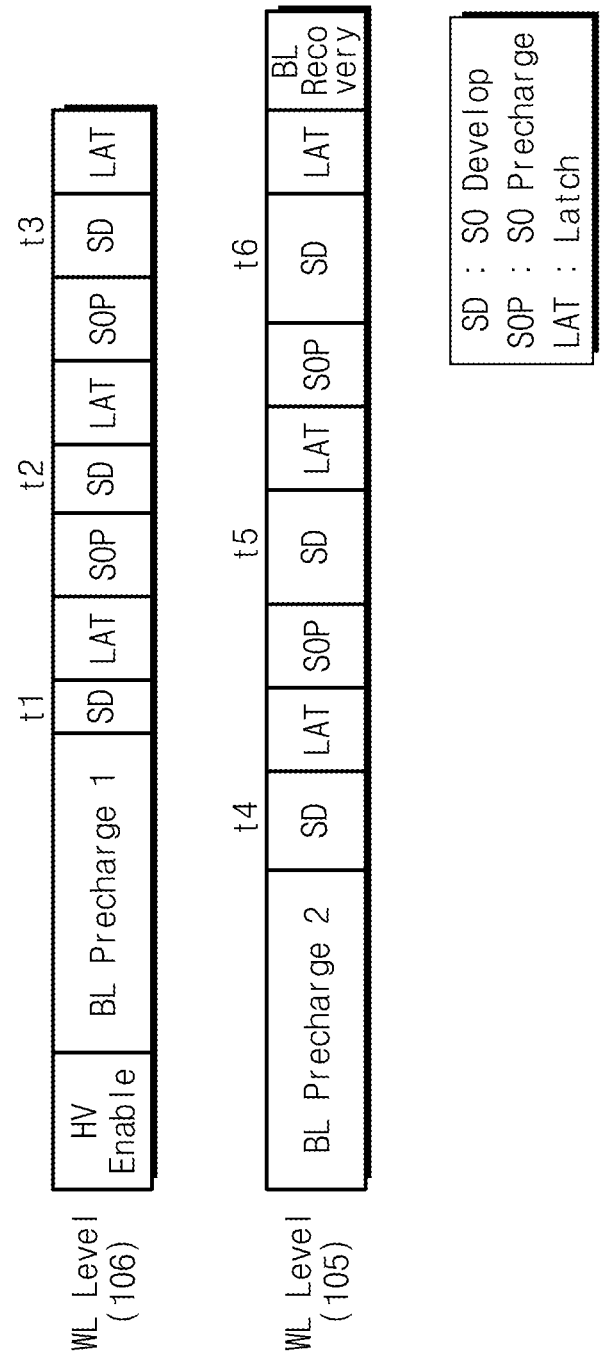
FIG. 19 is a diagram for describing a soft-decision read operation of a nonvolatile memory device according to another embodiment of the inventive concept.

FIG. 19 is a diagram for describing a soft-decision read operation of a nonvolatile memory device according to another embodiment of the inventive concept.

In the case where a voltage difference between word line voltages (e.g., 105 and 107) at a soft-decision read operation is large, latch operations may be continuously performed in the same manner as described in FIG. 6 with a word line voltage 106 supplied to a selected word line, and then latch operations may be continuously performed in the same manner as described in FIG. 6 with a word line voltage 105 supplied to the selected word line. At this time, since a word line voltage is changed, a bit line pre-charging operation may be accompanied. A soft-decision read operation illustrated in FIG. 19 may be the same or substantially the same as that in FIG. 18 except for the above-described difference.

With the above description, it is possible to detect memory cell having different threshold voltages without a variation in a word line voltage. This may mean that a setup time required to vary a word line voltage is unnecessary. Further, upon execution of continuous sensing operations, a voltage of a bit line may be maintained constantly (or, with a pre-charged voltage). That is, it is possible to reduce a time taken to pre-charge a bit line. Thus, a read/program time (or, a response time to a read/write request of a host) may be shortened. Further, since a word line voltage is not varied during continuous sensing operations, a time required to set a word line voltage may be reduced.

Unlike the description made in relation to FIGS. 18 and 19, develop times can be decided in a descending order. For example, a latch operation requiring the longest develop time may be performed first, and a latch operation requiring the shortest develop time may be carried out finally.

Figure 20:
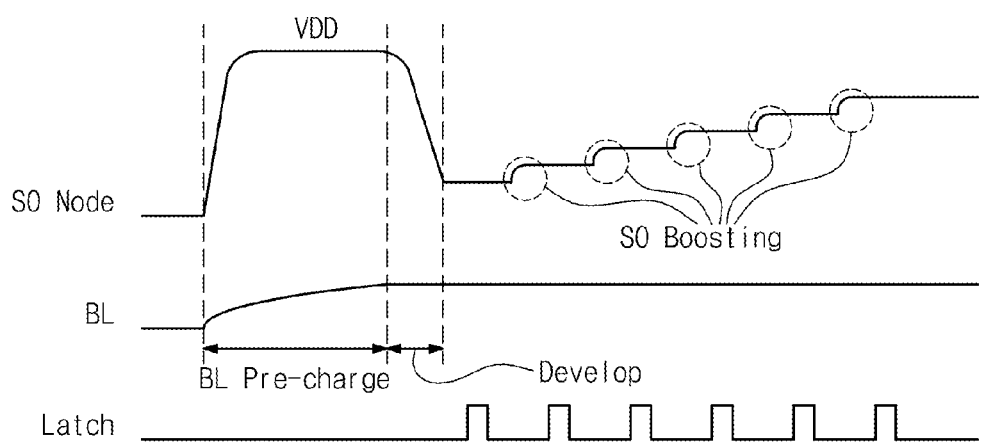
FIG. 20 is a diagram for describing a soft-decision read operation of a nonvolatile memory device according to still another embodiment of the inventive concept.

FIG. 20 is a diagram for describing a soft-decision read operation of a nonvolatile memory device according to still another embodiment of the inventive concept.

Referring to FIG. 20, a soft-decision read operation may be performed using a sensing node boosting scheme described in relation to FIGS. 10 and 11. First, a bit line may be pre-charged with a predetermined voltage. At this time, a sensing node SO may be pre-charged with a power supply voltage. During a given time (e.g., t2), a voltage of the sensing node SO may be developed. Then, a latch operation may be performed. After the latch operation is performed, as illustrated in FIG. 20, a voltage of the sensing node SO may be continuously boosted. A voltage of the sensing node SO may be latched whenever a voltage of the sensing node SO is boosted. In FIG. 20, there is illustrated an example in which a voltage of the sensing node SO is boosted sequentially. However, it will be well understood that a voltage of the sensing node SO may be controlled to be decreased sequentially.

With the above description, it is possible to detect memory cells having different threshold voltages without a variation in a word line voltage. This may mean that a setup time required to vary a word line voltage is unnecessary. Further, upon execution of continuous sensing operations, a voltage of a bit line may be maintained constantly (or, with a pre-charged voltage). That is, it is possible to reduce a time taken to pre-charge a bit line. Thus, a read/program time (or, a response time to a read/write request of a host) may be shortened.

As described above, although not shown in figures, the above-described sensing scheme can be applied to a read retry operation. An example of a read retry operation is disclosed in U.S. Patent Publication No. 2010/0322007, the entirety of which is incorporated by reference herein.

Figure 21:
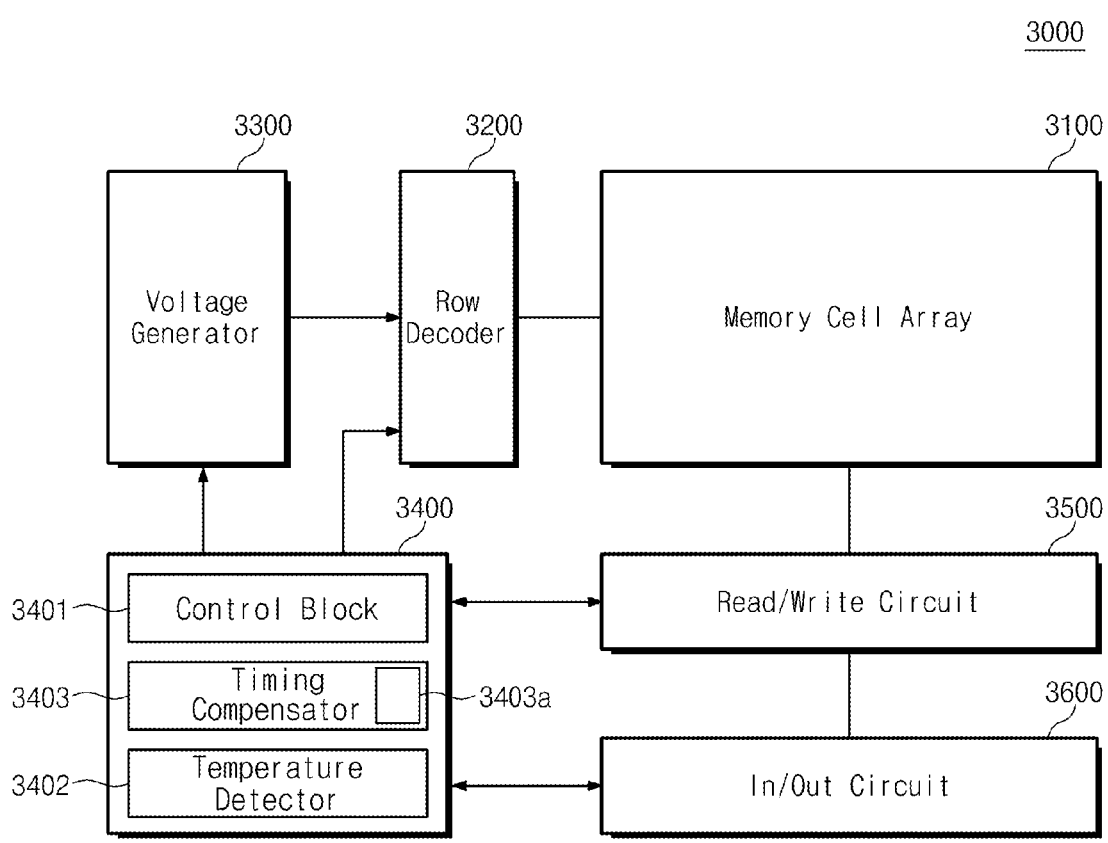
FIG. 21 is a block diagram schematically illustrating a nonvolatile memory device according to still another embodiment of the inventive concept.

FIG. 21 is a block diagram schematically illustrating a nonvolatile memory device according to still another embodiment of the inventive concept.

Referring to FIG. 21, a nonvolatile memory device 3000 may include a memory cell array 3100, a row selector circuit 3200, a voltage generator circuit 3300, control logic 3400, a read/write circuit 3500, and an input/output circuit 3600. The nonvolatile memory device 3000 in FIG. 21 may be the same or substantially the same as that in FIG. 2 or 8 except for the control logic 3400, and a description thereof is thus omitted.

The control logic 3400 may include a control block 3401, a temperature detector 3402, and a timing compensator 3403. The control block 3401 may control an overall operation of the nonvolatile memory device 3000. For example, the control block 3401 may be configured to control develop times of continuous sensing operations or a boosting level of a sensing node.

The temperature detector 3402 may be configured to detect a temperature of the nonvolatile memory device 3000. The detection result may be provided to the timing compensator 3403. The timing compensator 3403 may include a register 3402a for storing compensation information. Herein, the compensation information may include develop time information and/or boosting level information for compensating a drain current varied due to a temperature variation, develop time information and/or boosting level information for compensating a drain current varied due to a PE cycle variation, develop time information and/or boosting level information varied according to a word line location, develop time information and/or boosting level information varied according to a sensing level, and the like. The timing compensator 3403 may provide the control block 3401 with develop time information and/or boosting level information based on at least one of the detection result of the temperature detector 3402, PE cycle information, word line location information, or sensing level information. The control block 3401 may control develop times of continuous sensing operations or a boosting level of a sensing node variably according to develop time information and/or boosting level information provided from the timing compensator 3403.

Figure 22:
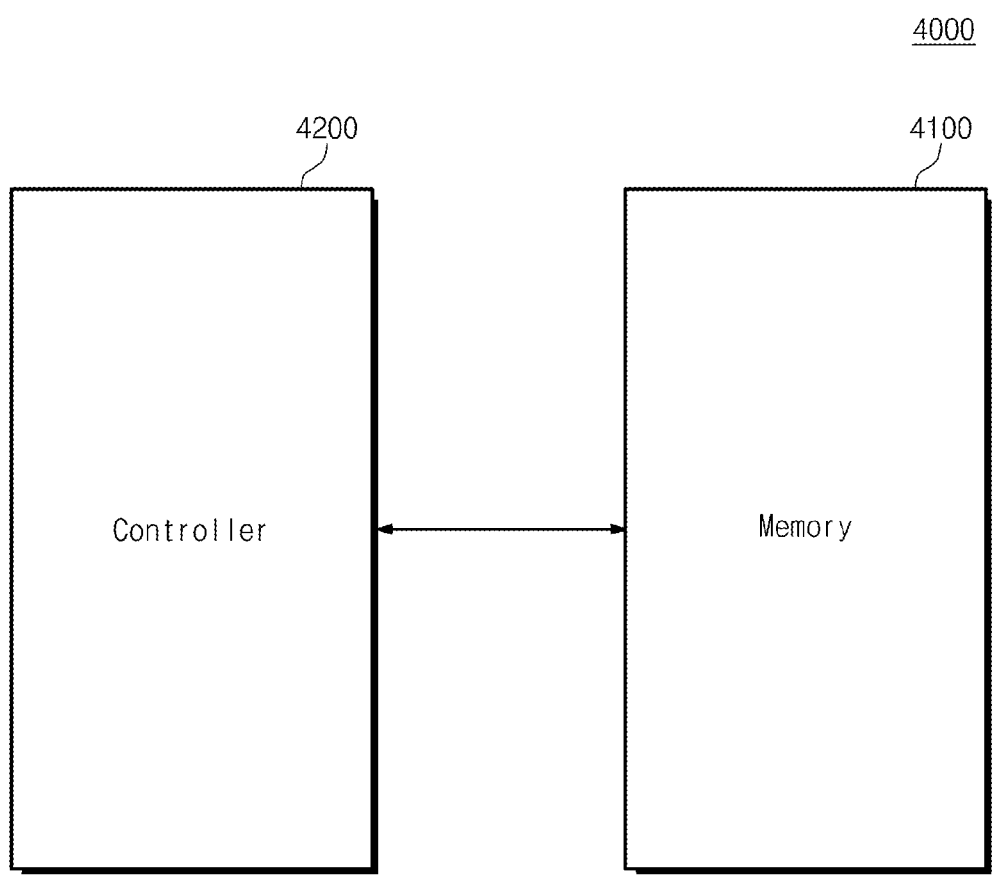
FIG. 22 is a block diagram schematically illustrating a memory system including a nonvolatile memory device according to embodiments of the inventive concept.

FIG. 22 is a block diagram schematically illustrating a memory system including a nonvolatile memory device according to embodiments of the inventive concept.

Referring to FIG. 22, a memory system may include at least one nonvolatile memory device 4100 and a controller 4200. The nonvolatile memory device 4100 may be the same as that illustrated in FIG. 2, 8, or 21, and may be configured to execute a data recover read method and a soft-decision read method described in relation to FIGS. 12 through 20. The controller 4200 may be configured to control the nonvolatile memory device 4100.

Figure 23:
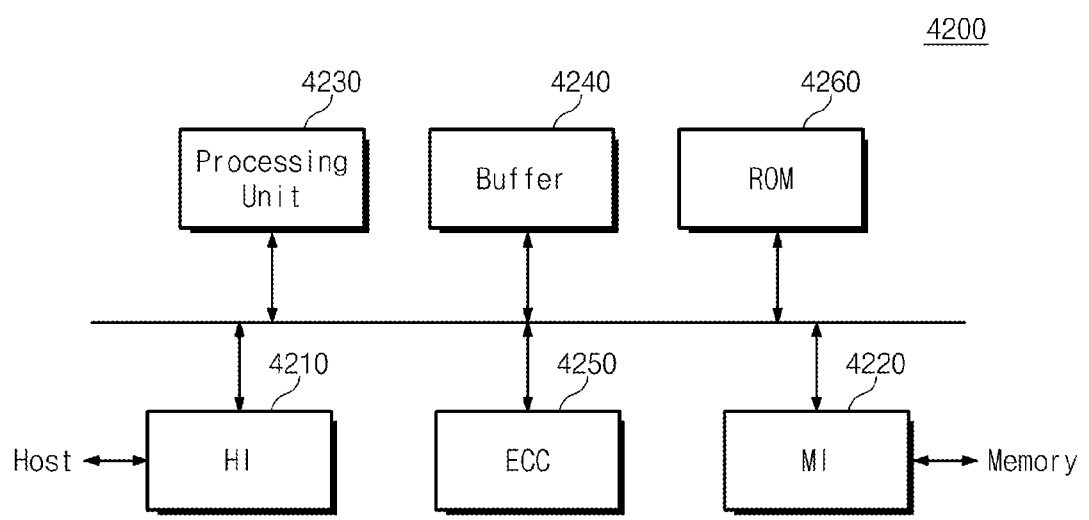
FIG. 23 is a block diagram schematically illustrating a memory controller in FIG. 22.

FIG. 23 is a block diagram schematically illustrating a memory controller in FIG. 22.

Referring to FIG. 23, a controller 4200 may include a first interface 4120, a second interface 4220, a processing unit 4230 such as CPU, a buffer memory 4240, an error detecting and correcting circuit 4250, and a ROM 4260.

The first interface 4210 as a host interface may be configured to interface with an external device (for example, a host), and the second interface 4220 as a memory interface may be configured to interface with a nonvolatile memory device 4100 illustrated in FIG. 22. The processing unit 4230, for example, CPU may be configured to control an overall operation of the controller 4200. The processing unit 4230 may be configured to operate firmware such as Flash Translation Layer (FTL) stored in the ROM 4260, for example. In another embodiment, it is possible to configure the controller 4200 not to include the ROM. In this case, the firmware in the ROM 4260 may be stored in a nonvolatile memory device 4100 controlled by the controller 4200, and may be loaded onto the controller 4200 from the nonvolatile memory device 4100 at power-up. The buffer memory 4240 may be used to temporarily store data transferred from an external device via the host interface 4210 or data transferred from the nonvolatile memory device 4100 via the memory interface 4220. The error detecting and correcting circuit 4250 may be configured to encode data to be stored in the nonvolatile memory device 4100 and to decode data read out from the nonvolatile memory device 4100.

In an exemplary embodiment, the host interface 4210 may be formed of one of computer bus standards, storage bus standards, and iFCPPeripheral bus standards, or a combination of two or more standards. The computer bus standards may include S-100 bus, Mbus, Smbus, Q-Bus, ISA, Zorro II, Zorro III, CAMAC, FASTBUS, LPC, EISA, VME, VXI, NuBus, TURBOchannel, MCA, Sbus, VLB, PCI, PXI, HP GSC bus, CoreConnect, InfiniBand, UPA, PCI-X, AGP, PCIe, Intel QuickPath Interconnect, Hyper Transport, etc. The storage bus standards may include ST-506, ESDI, SMD, Parallel ATA, DMA, SSA, HIPPI, USB MSC, FireWire(1394), Serial ATA, eSATA, SCSI, Parallel SCSI, Serial Attached SCSI, Fibre Channel, iSCSI, SAS, RapidIO, FCIP, etc. The iFCP-Peripheral bus standards may include Apple Desktop Bus, HIL, MIDI, Multibus, RS-232, DMX512-A, EIA/RS-422, IEEE-1284, UNI/O, 1-Wire, I2C, SPI, EIA/RS-485, USB, Camera Link, External PCIe, Light Peak, Multidrop Bus, and so on.

Figure 24:
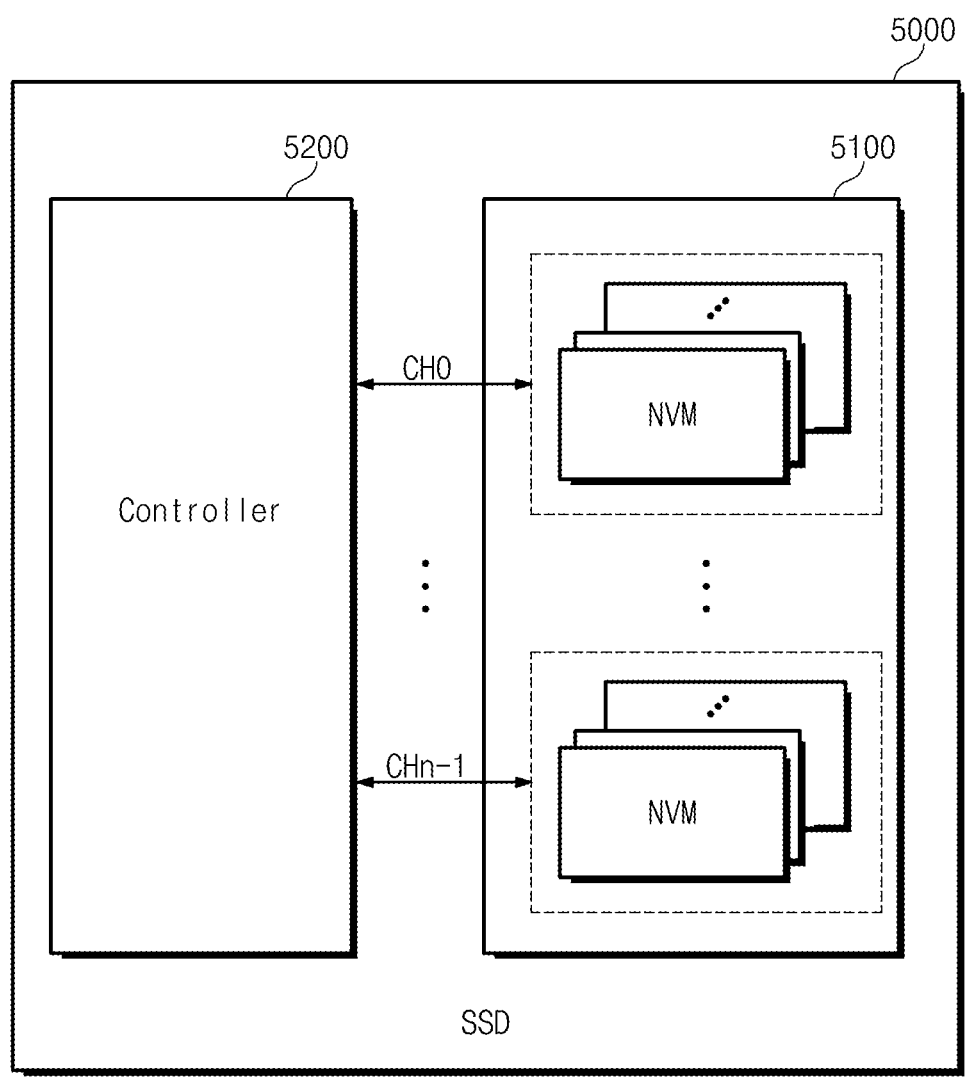
FIG. 24 is a block diagram schematically illustrating a solid state drive using a nonvolatile memory device according to embodiments of the inventive concept.

FIG. 24 is a block diagram schematically illustrating a solid state drive using a nonvolatile memory device according to embodiments of the inventive concept.

Referring to FIG. 24, a solid state drive (SSD) 5000 may comprise storage medium 5100 and a controller 5200. The storage medium 5100 may be connected with the controller 5200 via a plurality of channels, each of which is connected in common with a plurality of nonvolatile memories NVM. Each nonvolatile memory NVM may be formed of a memory which is the same or substantially the same as that illustrated in FIG. 2, 8, or 21 and is configured to execute a data recover read method and a soft-decision read method described in relation to FIGS. 12 through 20. The controller 5200 may be the same or substantially the same as that described in relation to FIG. 23.

FIGS. 25 to 29 are diagrams schematically illustrating other systems to which a nonvolatile memory device according to embodiments of the inventive concept is applied.

Figure 25:
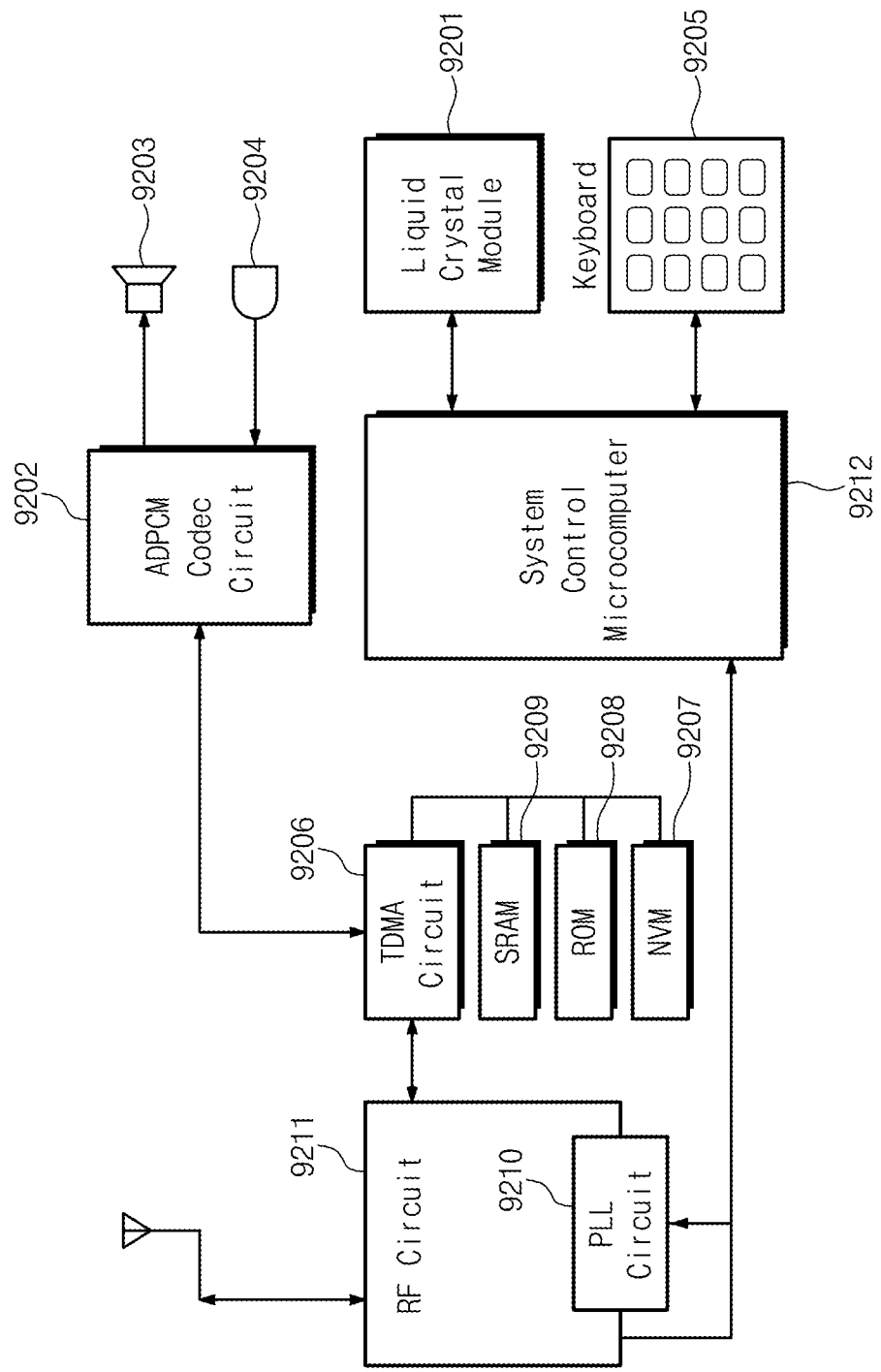
FIG. 25 is a block diagram schematically illustrating a cellular phone system to which a nonvolatile memory device according to embodiments of the inventive concept is applied.

FIG. 25 is a block diagram schematically illustrating a cellular phone system to which a nonvolatile memory device according to embodiments of the inventive concept is applied.

Referring to FIG. 25, a cellular phone system may include an ADPCM codec circuit 9202 for compressing and decompressing a voice signal, a speaker 9203, a microphone 9204, a TDMA circuit 9206 for time-division multiplexing digital data, a PLL circuit 9210 configured to set a carrier frequency of a radio frequency signal, an RF circuit 9211 configured to send and receive a radio frequency signal, and the like.

Further, the cellular phone system may include various types of memories, such as a nonvolatile memory device 9207, a ROM 9208, and an SRAM 9209. The nonvolatile memory device 9207 may be the same or substantially the same as that illustrated in FIG. 2, 8, or 21, and may be configured to execute a data recover read method and a soft-decision read method described in relation to FIGS. 12 through 20. The ROM 9208 may be used to store programs, and the SRAM 9209 may be used as a work region for the system control microcomputer 9212 or/and to temporarily store data. Herein, the system control microcomputer 9212 is a processor which is configured to control write and read operations of the nonvolatile memory device 9207.

Figure 26:
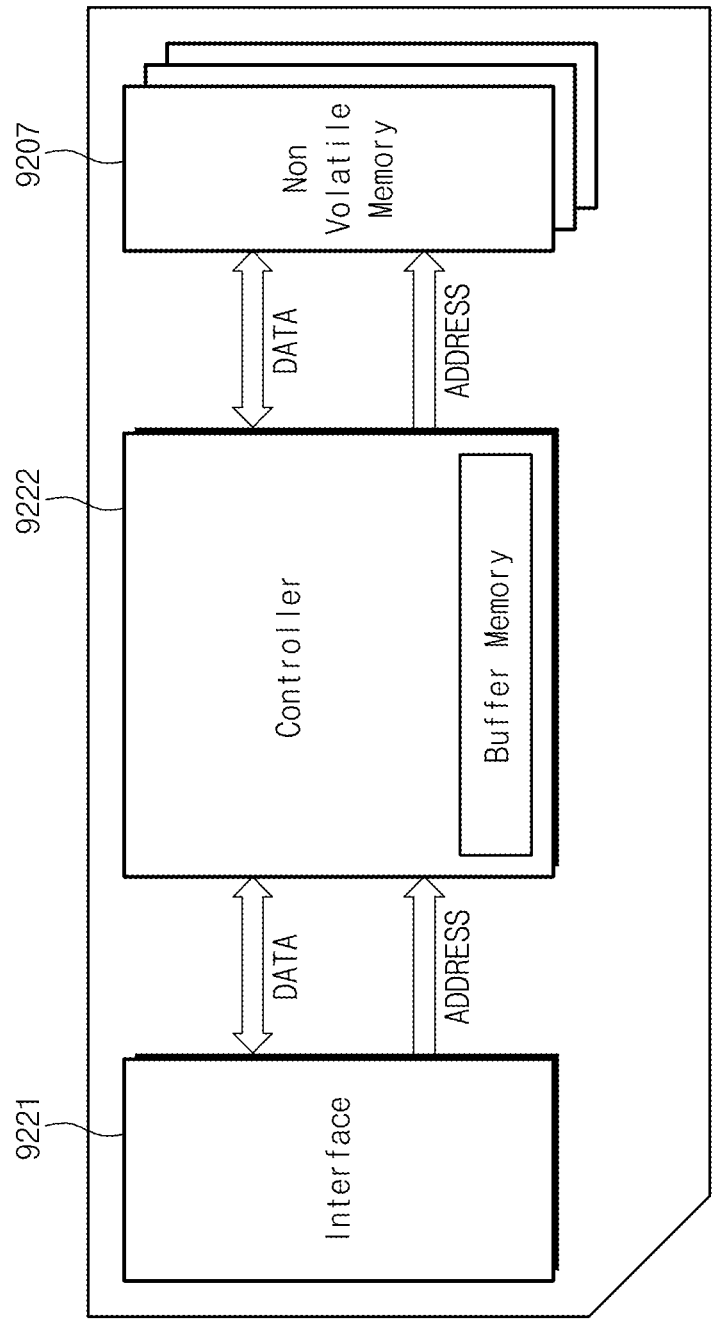
FIG. 26 is a block diagram schematically illustrating a memory card to which a nonvolatile memory device according to embodiments of the inventive concept is applied.

FIG. 26 is a block diagram schematically illustrating a memory card to which a nonvolatile memory device according to embodiments of the inventive concept is applied. A memory card, for example, may be an MMC card, an SD card, a multiuse card, a micro-SD card, a memory stick, a compact SD card, an ID card, a PCMCIA card, an SSD card, a chip-card, a smartcard, an USB card, or the like.

Referring to FIG. 26, the memory card may include an interface circuit 9221 for interfacing with an external device, a controller 9222 including a buffer memory and controlling an operation of the memory card, and at least one nonvolatile memory device 9207. The nonvolatile memory device 9207 may be the same or substantially the same as that illustrated in FIG. 2, 8, or 21, and may be configured to execute a data recover read method and a soft-decision read method described in relation to FIGS. 12 through 20. The controller 9222 may be a processor which is configured to control write and read operations of the flash memory device 9207. In particular, the controller 9222 may be coupled with the nonvolatile memory device 9207 and the interface circuit 9221 via a data bus DATA and an address bus ADDRESS.

Figure 27:
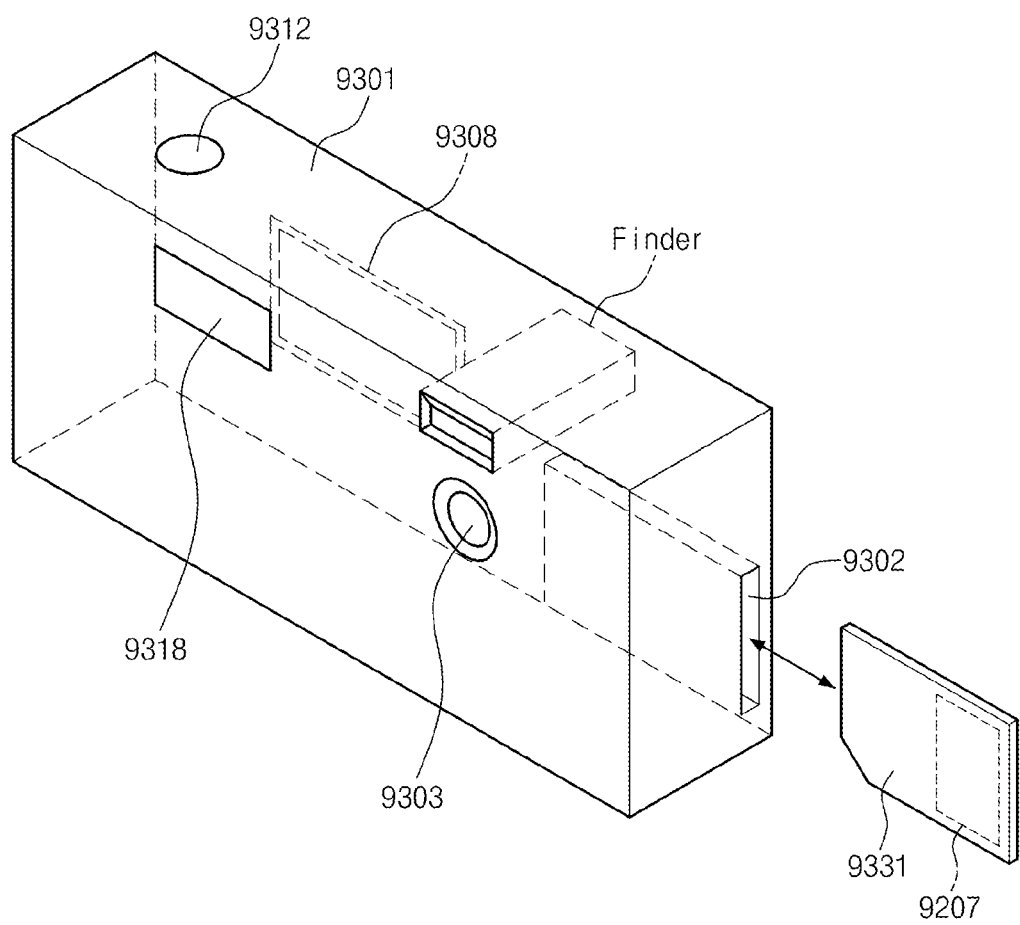
FIG. 27 is a block diagram schematically illustrating a digital still camera to which a nonvolatile memory device according to embodiments of the inventive concept is applied.

FIG. 27 is a block diagram schematically illustrating a digital still camera to which a nonvolatile memory device according to embodiments of the inventive concept is applied.

Referring to FIG. 27, a digital still camera may include a body 9301, a slot 9302, a lens 9303, a display circuit 9308, a shutter button 9312, a strobe 9318, and the like. In particular, a memory card 9331 may be inserted in the slot 9302 and include at least one nonvolatile memory device 9207 according to embodiments of the inventive concept. The nonvolatile memory device 9207 may be the same or substantially the same as that illustrated in FIG. 2, 8, or 21, and may be configured to execute a data recover read method and a soft-decision read method described in relation to FIGS. 12 through 20.

If the memory card 9331 is a contact type memory card, an electric circuit on a circuit board may be electrically contacted with the memory card 9331 when it is inserted in the slot 9308. In the event that the memory card 931 is a non-contact type memory card, an electric circuit on a circuit board may communicate with the memory card 9331 by radio-frequency or wireless communication.

Figure 28:
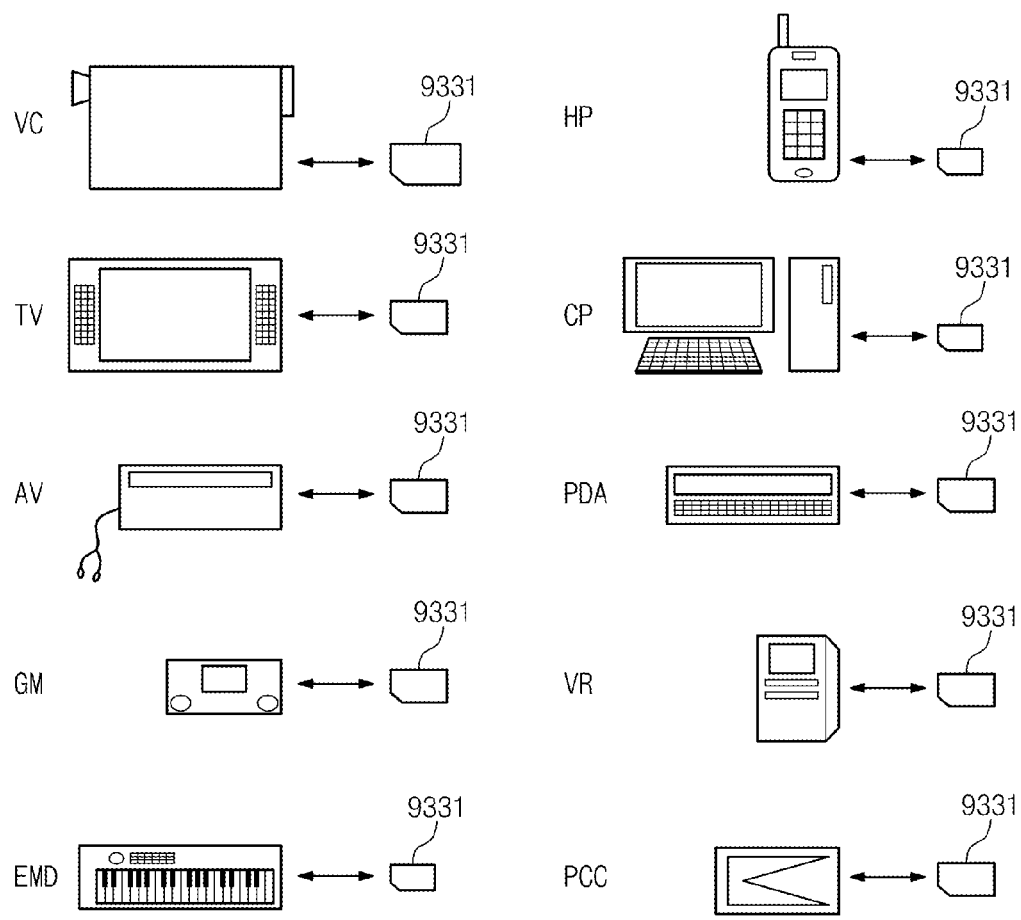
FIG. 28 is a diagram illustrating various systems to which a memory card in FIG. 27 is applied.

FIG. 28 is a diagram illustrating various systems to which a memory card in FIG. 27 is applied.

Referring to FIG. 28, a memory card 9331 may be applied to a video camera VC, a television TV, an audio device AV, a game machine GM, an electronic music device EMD, a cellular phone HP, a computer CP, a Personal Digital Assistant PDA, a voice recorder VR, a PC card PCC, and the like.

Figure 29:
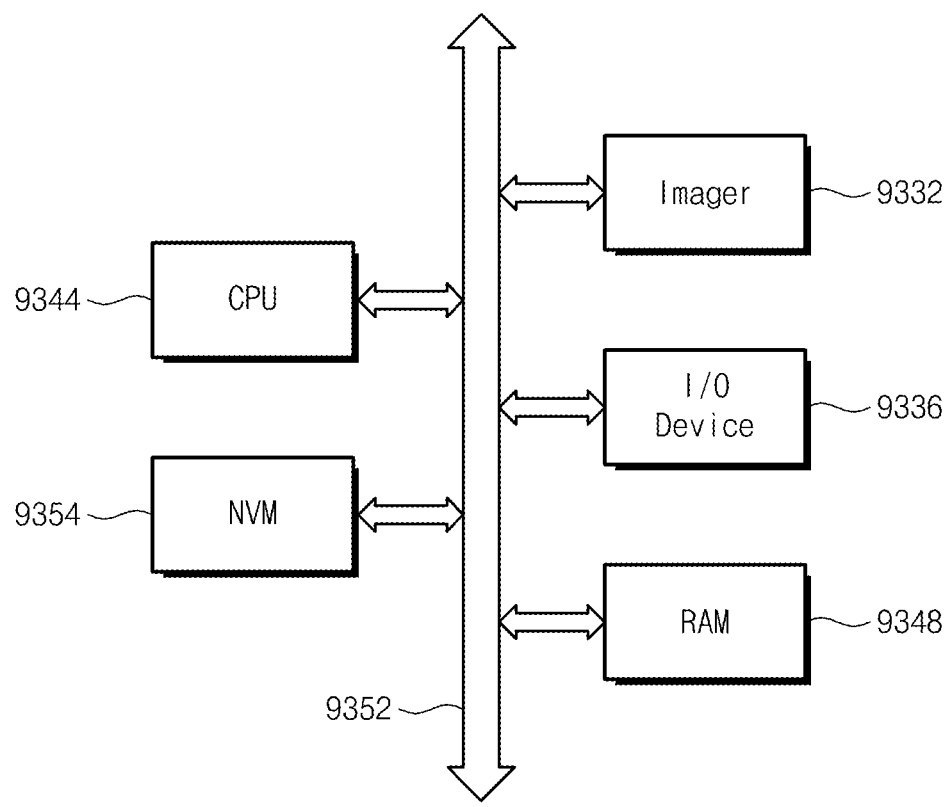
FIG. 29 is a block diagram schematically illustrating an image sensor system to which a nonvolatile memory device according to embodiments of the inventive concept is applied.

FIG. 29 is a block diagram schematically illustrating an image sensor system to which a nonvolatile memory device according to embodiments of the inventive concept is applied.

Referring to FIG. 29, an image sensor system may include an image sensor 9332, an input/output device 9336, RAM 9348, CPU 9344, and a nonvolatile memory device 9354. The nonvolatile memory device 9354 may be the same or substantially the same as that illustrated in FIG. 2, 8, or 21, and may be configured to execute a data recover read method and a soft-decision read method described in relation to FIGS. 12 through 20. Elements in FIG. 29, that is, the image sensor 9332, the input/output device 9336, the RAM 9348, the CPU 9344, and the nonvolatile memory device 9354 may communicate with one another via a bus 9352. The image sensor 9332 may include a photo sensing device such as a photo-gate, photo-diode, or the like. Each element may be formed of a single chip together with a processor or independently from the processor.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A read method of a nonvolatile memory device which includes memory cells, the read method comprising:
    supplying a read voltage to a selected word line connected to a selected memory cell;
    applying a pre-charged voltage to a bit line connected to the selected memory cell;
    varying voltage of a sensing node corresponding to the bit line connected to the selected memory cell during a first time;
    latching the varied voltage of the sensing node as first data;
    boosting the sensing node by using a capacitor connected to the sensing node;
    varying voltage of the sensing node corresponding to the bit line connected to the selected memory cell during a second time different from the first time; and
    latching the varied voltage of the boosted sensing node as second data,
    wherein the read voltage applied to the selected word line and the pre-charged voltage applied to the bit line are maintained constantly during the first time and the second time.

2. The read method of claim 1, wherein the first time is shorter than the second time.

3. The read method of claim 2, wherein the first time is set such that a memory cell having a threshold voltage lower by a predetermined voltage than the read voltage is determined to be an off cell.

4. The read method of claim 3, wherein the second time is set such that the memory cell having the threshold voltage lower by the predetermined voltage than the read voltage is determined to be an on cell.

5. The read method of claim 1, wherein the first data indicates a memory cell having a threshold voltage higher than the read voltage and a memory cell having a threshold voltage lower by a predetermined voltage than the read voltage.

6. The read method of claim 5, wherein the second data indicates a memory cell having a threshold voltage higher than the read voltage.

7. The read method of claim 6, wherein the memory cell having the threshold voltage lower by a predetermined voltage than the read voltage is judged based on the first data and the second data without a variation in the read voltage.

8. The read method of claim 7, wherein a bit line connected to the memory cell having the threshold voltage lower by a predetermined voltage than the read voltage is driven with a bit line forcing voltage according to the judgment result at a next program loop of 2-step verify scheme.

9. The read method of claim 1, wherein the read voltage supplied to the selected word line is blocked after latching the varied voltage of the boosted sensing node as the second data.

10. The read method of claim 1, wherein the bit line is driven to maintain a pre-charged state until the varied voltage of the boosted sensing node is latched as the second data.

11. The read method of claim 1, wherein the capacitor is formed of a MOS transistor.

12. The read method of claim 1, wherein the capacitor is formed using the sensing node and an adjacent signal line.

13. A program method of a multi-bit memory device which includes memory cells each storing multi-bit data, the program method comprising:
    Programming a selected memory cell of a selected word line based on program data; and
    determining whether the selected memory cell of the selected word line is programmed to have target state,
    wherein determining whether the selected memory cell of the selected word line is programmed to have target state comprises a plurality of verification operations, each verification operation including a verification period formed of a bit line pre-charge period, a first sensing node develop period, a first latch period, a sensing node boost period, a second sensing node develop period, and a second latch period; and
    wherein a verification voltage applied to the selected word line is constant at each verification operation, bit line connected to the selected memory cell of the selected word line is driven until the second latch period such that voltage of the bit line pre-charged during the bit line pre-charge period is constant, and sensing node is boosted by using a capacitor connected to the sensing node during the sensing node boost period.

14. The program method of claim 13, wherein a develop time of the first sensing node develop period is shorter than a develop time of the second sensing node develop period.

15. The program method of claim 13, wherein a develop time of the first sensing node develop period is set such that a memory cell having a threshold voltage lower by a predetermined voltage than the verification voltage applied to the selected word line at each verification operation is determined to be an off cell; and
  wherein a develop time of the second sensing node develop period is set such that the memory cell having the threshold voltage lower by the predetermined voltage than a verification voltage applied to the selected word line at each verification operation is determined to be an on cell.

16. The program method of claim 13, wherein a memory cell having a threshold voltage lower by a predetermined voltage than the verification voltage applied to the selected word line at each verification operation is determined based on data latched at the first latch period and data latched at the second latch period; and
  wherein a bit line connected to a memory cell having a threshold voltage lower by a predetermined voltage than the verification voltage applied to the selected word line is driven with a bit line forcing voltage according to the judgment result at a next program loop.

17. A nonvolatile memory device comprising:
a memory cell array having memory cells;
a row selector circuit configured to drive a selected on of word lines; and
a read/write circuit having page buffers respectively connected to bit lines; and
control logic configured to control the read/write circuit and the row selector circuit,
wherein the control logic controls a read operation in which a bit line connected to a selected memory cell of a selected word line supplied with a read voltage is pre-charged and voltage of a sensing node corresponding to the bit line is latched at least two times as first data and second data under a condition the pre-charged voltage of the bit line and the read voltage supplied to the selected word line are maintained constantly; and
wherein the control logic controls the sensing node to be boosted by using a capacitor connected to the sensing node before latching the boosted sensing node as the second data.

18. The nonvolatile memory device of claim 17, wherein the control logic determines a memory cell having a threshold voltage lower by a predetermined voltage than the read voltage supplied to the selected word line based on the first and second data; and
  wherein a bit line connected to a memory cell having a threshold voltage lower by a predetermined voltage than the read voltage supplied to the selected word line is driven with a bit line forcing voltage according to the judgment result at a next program loop.

19. The nonvolatile memory device of claim 17, wherein the capacitor is formed of a MOS transistor.

20. The nonvolatile memory device of claim 17, wherein the capacitor is formed using the sensing node and an adjacent signal line.

* * * * *